(12) United States Patent
Ito et al.

(10) Patent No.: US 7,652,863 B2
(45) Date of Patent: *Jan. 26, 2010

(54) SEMICONDUCTOR INTEGRATED CIRCUIT

(75) Inventors: Takayasu Ito, Tokyo (JP); Mitsuru Hiraki, Tokyo (JP); Satoshi Baba, Tokyo (JP); Kenichi Fukui, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/251,519

(22) Filed: Oct. 15, 2008

(65) Prior Publication Data
US 2009/0039846 A1 Feb. 12, 2009

Related U.S. Application Data

(63) Continuation of application No. 11/606,031, filed on Nov. 30, 2006, now Pat. No. 7,450,361.

(30) Foreign Application Priority Data
Dec. 28, 2005 (JP) ............................. 2005-377570

(51) Int. Cl.
H02H 3/08 (2006.01)
(52) U.S. Cl. ..................................... 361/93.1
(58) Field of Classification Search ................. 361/93.1
See application file for complete search history.

(56) References Cited

U.S. PATENT DOCUMENTS

| 6,911,867 B2 | 6/2005 | Tzeng et al. |
| 7,019,507 B1 | 3/2006 | Dittmer et al. |
| 7,102,395 B2 | 9/2006 | Saito |
| 2007/0090817 A1 | 4/2007 | Yee |
| 2007/0223164 A1 | 9/2007 | Oki et al. |

FOREIGN PATENT DOCUMENTS

| JP | 2003-330555 A | 11/2003 |
| WO | WO 2005109589 A1 | 11/2005 |

*Primary Examiner*—Ronald W Leja
*Assistant Examiner*—Christopher J Clark
(74) *Attorney, Agent, or Firm*—Miles & Stockbridge P.C.

(57) ABSTRACT

In order to set with a high precision the value of rush current flowing in the power switch circuit at the time of turning "on" the power, the internal circuit Int_Cir of the LSI is supplied with the internal source voltage Vint from the output transistor MP1 of the regulator VReg of the power switch circuit PSWC. The power switch circuit PSWC includes a control circuit CNTRLR and a start-up circuit STC. During the initial period Tint following the turning "on" of the power supply, the start-up circuit STC controls the output transistor MP1 and reduces the primary rush current so that the output current Isup of the output transistor MP1 may represent an approximately constant increment as the time passes. The difference ΔV between the internal current voltage due to the charge of load capacitance C with the output current Isup controlled by the start-up circuit STC and the current voltage Vint from the regulator VReg is set within the predetermined limit to reduce the secondary rush current.

5 Claims, 13 Drawing Sheets

$Isup = \dfrac{n}{m} \cdot Iref$ $Iref = \dfrac{VLS}{R}$ $$Iref = \frac{V_{LS}}{R}$$

$Isup = \dfrac{n}{m} \cdot Iref$ $Iref = \dfrac{V_{LS}}{R}$

SEMICONDUCTOR INTEGRATED CIRCUIT

CROSS-REFERENCE TO RELATED APPLICATION

This application is a continuation of application Ser. No. 11/606,031 filed Nov. 30, 2006 now U.S. Pat. No. 7,450,361. The present application also claims priority from Japanese patent application No. 2005-377570 filed on Dec. 28, 2005, the content of which is hereby incorporated by reference into this application.

BACKGROUND OF THE INVENTION

The present invention relates to a semiconductor integrated circuit, in particular to a technology useful for setting the value of rush current flowing in the power switch circuit at the time of turning "on" the power supply with a high precision.

The leak current per transistor is increasing and the number of on-chip transistors is also increasing due to the transistor-size scaling of semiconductor integrated circuits such as CMOS digital LSI. This increases the standby power of the whole chip to a very serious level.

As described in the document: A. Fahim, "Low-leakage current, low-area voltage, regulator for system-on-chip processors", ELECTRONICS LETTERS. 15 Sep. 2005, VOL. 41, NO. 19, generally a P-channel MOS transistor playing the role of a switch between the power supply and the microprocessor is used in order to reduce the standby consumption power. In the disabled state that shut off the microprocessor, the leak power serves as the cutoff current of the P-channel MOS transistors.

On the other hand, the method proposed in the Japanese Unexamined Patent Publication No. 2003-330555 describes the following technology. The stabilizing power circuit mounted on a semiconductor integrated circuit includes an output control MOS transistor for outputting an internal source voltage from an external source voltage inputted therein and an error amplifier for comparing the feedback voltage from the internal source voltage and the reference voltage and for controlling the gate of the output control MOS transistor. When the power supply is turned "on", the stabilizing power circuit for normal operation does not enter into operation, but a start-up circuit including a diode-connected MOS transistor with drain gate short-circuited, a switch for operating this diode-connected MOS transistor and the output control MOS transistor as current mirrors and a time constant circuit enters into operation. After the power is turned "on", the switch is on during a time constant period of time determined by the resistances and capacitors of the time constant circuit, and the drain gate short-circuited and diode-connected MOS transistor and the output control MOS transistor work as current mirrors. Therefore, during the time-constant period of time, the current of the output control MOS transistor is limited to the current value determined by the mirror ratio of the current mirror. This limitation of current limits excessive rush current at the time of turning "on" the power supply. After the time constant length of time has passed, the switch is turned "off", and the output control MOS transistor is controlled by the output of the error amplifier, and the stabilizing power circuit starts operating normally.

SUMMARY OF THE INVENTION

Prior to the present invention, the inventors examined the following points regarding the background art mentioned above.

The rush current generated at the time of turning "on" the power supply can be more or less limited for the time constant period by the limitation of current determined by the mirror ratio of the current mirrors of the start-up circuit by the method proposed in the Japanese Unexamined Patent Publication No. 2003-330555 mentioned above.

Immediately after the turning "on" of the power supply, very large rush current flows in the internal circuit of the semiconductor integrated circuit from the output control MOS transistor controlled by the start-up circuit. This is because this large rush current flows as the primary rush current in order to charge the load capacitance of the internal circuit at first. If the limiting current value by the current mirrors is set at a small value, the primary rush current can be reduced. However, it will take longer time to charge initially the load capacitance of the internal circuit. If a large value is set for the limiting current value by the current mirror, the time required to initially to charge the load capacitance of the internal circuit will be shorter, but the primary rush current will increase.

And, depending on the timing of the time constant period of length of the start-up circuit, the current of the output control MOS transistor changes radically from the limit current value determined by the mirror ratio of the current mirrors to the output current of the normally working stabilizing power circuit. This is due to frequent differences between the definitive internal source voltage value by the timing of the time constant period of time of the start-up circuit due to the charge of the load capacitance of the internal circuit by the limit current outputted by the output control MOS transistor and the internal source voltage value outputted by the stabilizing power supply circuit for normal operation after the passage of the time constant period of time of the start-up circuit. If this difference is great, it will cause a large secondary rush current.

In addition, according to the method proposed by the Japanese Unexamined Patent Publication No. 2003-330555, during the last period of the time constant period of time of the start-up circuit, the value of current flowing in the MOS transistor for output control decreases as the charge of the load capacitance progresses. Therefore, sometimes there occurs a phenomenon of the final internal source voltage outputted from the start-up circuit falling below the internal source voltage outputted by the subsequent normally working stabilizing power supply circuit. This difference in the internal source voltage constitutes one of the causes of the large secondary rush current described above.

In a very large scale integration (VLSI) wherein the internal logical circuit to which the internal source voltage is outputted by the stabilizing power circuit is of a very large scale, an excessively large magnitude of such primary rush current or secondary primary current brings about the following problems.

Because of the insufficiency of current driving ability of external power devices such as power IC supplying external source voltage to the VLSI, the wiring parasite resistance or the wiring parasite inductance of printed wiring boards with this external power device mounted thereon, large rush current causes a temporary drop of the external source voltage. Due to this temporary drop in the external source voltage, the internal source voltage supplied to the internal logic circuit also drops temporarily. As a result, the internal source voltage supplied to the internal logic circuit returns to the stable value, causing the starting time for enabling the internal logic circuit to start the normal logical operation to be longer. As a result, the system maker who is a user of the VLSI is obliged to specify the variation of current per hour of the primary rush current of the VLSI at the time of turning "on" the power to the semiconductor maker of the VLSI between the maximum allowance and the minimum allowance. In addition, the presence of a large rush current in the semiconductor integrated circuit constitutes a stress to the internal power supply wiring of the semiconductor integrated circuit, resulting ultimately in the breaking of the internal power supply wiring and constituting a problem of reliability in electromigration.

Therefore, the present invention was made on the basis of the result of examination on the background art by the inventors as described above. Accordingly, the object of the present invention is to provide a semiconductor integrated circuit wherein the value of the rush current flowing in the power switch circuit at the time of turning "on" the power can be set with a high precision. And a more specific object of the present invention is to set with a high precision the value of the primary rush current to charge the load capacitance of the internal circuit at first. And another more specific object of the present invention is to set with a high precision the value of the secondary rush current resulting from the difference in the internal source voltage as described above.

Another object of the present invention is to make the value of internal source voltage outputted by the starting operation at the time of turning "on" the power approach the value of the internal source voltage outputted by the normal operation after the startup. Another object of the present invention is to improve reliability relating to the electromigration of the internal power supply wiring of the semiconductor integrated circuit.

The above-mentioned and other objects and new characteristics of the present invention will be clear by referring the present specification and the attached drawings.

We will describe briefly the representative inventions from those disclosed in the present application as follows.

A semiconductor integrated circuit according to a mode of carrying out of the present invention includes a power switch circuit (PSWC) and an internal circuit (Int_Cir) to which the internal source voltage (Vint) from the power switch circuit (PSWC) is supplied. The power switch circuit (PSWC) start outputting the internal source voltage (Vint) to be supplied into semiconductor chips (Chip) from the external source voltage (Vext) supplied from the outside of the semiconductor chips (Chip). The power switch circuit (PSWC) includes an output transistor (MP1), a start-up circuit (STC) and a control circuit (CNTRLR) for controlling the start-up circuit (STC). The output transistor (MP1) is fed with the external source voltage (Vext) and outputs the internal source voltage (Vint). The start-up circuit (STC) controls the output transistor (MP1) in such a way that an output current (Isup) controlled to the predetermined value may flow to the output transistor (MP1) during the initial period (Tint) of turning "on" the external power supply. In response to the turning "on" of the external power supply, the control circuit (CONTRLR) controls the start-up circuit (STC). As a result, the start-up circuit (STC) controls the output transistor (MP1) so that the output current (Isup) flowing in the output transistor (MP1) during the initial period (Tint) following the turning "on" of the external power supply may effectively constitute a constant increment as the time passes.

According to a mode of carrying out described above of the present invention, during the initial period (Tint) of turning "on" the external power supply, the start-up circuit (STC) controls the output transistor (MP1) so that the output current (Isup) flowing to the output transistor (MP1) may effectively constitute a constant increment in relation to the time change. Therefore, it will be possible to control with a high precision the primary rush current for initially charging the load capacitance (C) of the internal circuit (Int_Cir) (see FIG. 1, FIG. 2 and FIG. 3).

In other words, a semiconductor integrated circuit according to another mode of carrying out the present invention includes a power switch circuit (PSWC), and an internal circuit (Int_Cir) to which the internal source voltage (Vint) from the power switch circuit (PSWC) is supplied. The power switch circuit (PSWC) start outputting the internal source voltage (Vint) to be supplied into semiconductor chips (Chip) from the external source voltage (Vext) supplied from the outside of the semiconductor chips (Chip). The power switch circuit (PSWC) includes an output transistor (MP1), a start-up circuit (STC) and a control circuit (CNTRLR) for controlling the start-up circuit (STC). The output transistor (MP1) is fed with the external source voltage (Vext) and outputs the internal source voltage (Vint). The start-up circuit (STC) controls the output transistor (MP1) in such a way that an output current (Isup) may flow in the output transistor (MP1) during the initial period (Tint) following the turning "on" of the external power supply. In response to the turning "on" of the external power supply, the control circuit (CNTRLR) controls the start-up circuit (STC). The semiconductor chip (Chip) further includes a regulator (VReg) for generating the internal source voltage (Vint) to be supplied to the internal circuit (Int_Cir) out of the external source voltage (Vext) supplied. It detects that the difference between the value of the internal source voltage (Vint) resulting from the charge of the load capacitance (C) of the internal circuit (Int_Cir) due to the output current (Isup) of the output transistor (MP1) controlled by the start-up circuit (STC) during the initial period (Tint) after the turning "on" of the external power supply and the value of the internal source voltage generated by the regulator (VReg) is within the predetermined limit. The semiconductor chip (Chip) includes further a switch (SW2) connected between the outputs of a voltage supply node (N1) and a regulator (VReg) to which either one voltage chosen between the internal source voltage (Vint) from the power switch circuit (PSWC) for the sake of the internal circuit (Int_Cir) and the internal source voltage (Vint) from the regulator (VReg) is supplied. Based on the result of detection described above, the control circuit (CNTRLR) keeps the switch (SW2) in the on state so that the internal source voltage (Vint) generated by the regulator (VReg) may be supplied to the internal circuit (Int_Cir). The internal source voltage (Vint) generated by the regulator (VReg) is supplied to the voltage supply node (N1) as the chosen one of the voltages.

According to a mode of carrying out described above of the present invention, the difference between the value of the internal source voltage (Vint) resulting from the charge of the load capacitance (C) due to the output current (Isup) of the output transistor (MP1) controlled by the start-up circuit (STC) and the value of the internal source voltage generated by the regulator (VReg) is set within the predetermined limit. Therefore, it will be possible to control with a high precision the secondary rush voltage resulting from this difference (see FIG. 1, FIG. 2 and FIG. 3).

In other words, in a semiconductor integrated circuit according to a more specific mode of carrying out of the present invention, the start-up circuit (STC) includes a bias element (MP2). The bias element (MP2) biases the output transistor (MP1) so that an output current (Isup) controlled to the predetermined value during the initial period (Tint) after the turning "on" of the external power supply may flow in the output transistor (MP1). The start-up circuit (STC) includes a first switch (SW1) and a startup current generating circuit (LSCG). The first switch (SW1) relates the current value of the output transistor (MP1) with the value of the bias element (MP2) in the initial period (Tint) after the turning "on" of the external power supply. The startup current generating circuit (LSCG) generates an output current (Iref) constituting effectively a constant increment in relation to the time change during the initial period (Tint) after the turning "on" of the external power supply. During the initial period (Tint) after the turning "on" of the external power supply, an output current (Iref) constituting effectively a constant increment from the startup current generating circuit (LSCG) is supplied to the bias element (MP2). Due to the fact that the first switch (SW1) is set in the on state by the control circuit (CNTRLR) during the initial period (Tint) after the turning "on" of the external power supply, the value of the current of the output transistor (MP1) is related with the current value of the bias element (MP2) After the passage of the initial period (Tint) after the turning "on" of the external power supply, the control circuit (CNTRLR) sets the first switch (SW1) in the off state. The current value of the output transistor (MP1) becomes effectively unrelated with the current value of the bias element (MP2).

In other words, a semiconductor integrated circuit according to a more specific mode of carrying out the present invention further includes a regulator (VReg) for generating an internal source voltage (Vint) to be supplied to the internal circuit (Int_Cir) based on the supply of an external source voltage (Vext). It detects that the difference between the value of the internal source voltage (Vint) resulting from the charge of the load capacitance (C) of the internal circuit (Int_Cir) due to the output current (Isup) of the output transistor (MP1) controlled by the start-up circuit (STC) during the initial period (Tint) after the turning "on" of the external power supply and the value of the internal source voltage (Vint) generated by the regulator (VReg) is within the predetermined limit. Based on the result of the detection, the control circuit (CNTRLR) controls the output transistor (MP1) so that any increase in relation to time change of the output current (Isup) flowing in the output transistor (MP1) may be halted.

In other words, a semiconductor integrated circuit according to a more specific mode of carrying out the present invention further includes a second switch (SW2) connected between the outputs of a voltage supply node (N1) and a regulator (VReg) to which either one voltage chosen between the internal source voltage (Vint) from the power switch circuit (PSWC) for the sake of the internal circuit (Int_Cir) and the internal source voltage (Vint) from the regulator (VReg) is supplied. Based on the result of detection described above, the increase in the output current (Isup) flowing in the output transistor (MP1) with the passage of time is halted. Then, the control circuit (CNTRLR) turns the second switch (SW2) "on" so that the internal source voltage (Vint) generated by the regulator (VReg) may be supplied to the internal circuit (Int_Cir). Therefore, the internal source voltage (Vint) generated by the regulator (VReg) may be supplied to the voltage supply node (N1) as one of the voltages selected.

In other words, in a semiconductor integrated circuit (MN2, MN3) according to a more specific mode of carrying out the present invention, the regulator (VReg) includes a reference voltage generator (Vref_G) and an error amplifier (Diff_Ampl). The error amplifier (Diff_Ampl) compares the level of the reference voltage (Vref) from the reference voltage generating circuit (Vref_G) and that of the internal source voltage (Vint) to be outputted to the voltage supply node (N1) and controls the level of the internal source voltage (Vint). The error amplifier (Diff_Ampl) detects that the difference between the value of the internal source voltage (Vint) by the charge of the load capacitance (C) of the internal circuit (Int_Cir) due to the output current (Isup) of the output transistor (MP1) during the initial period (Tint) after the turning "on" of the external power supply and the value of the internal source voltage (Vint) generated by the regulator (VReg) is within the predetermined limit.

In other words, a semiconductor integrated circuit according to a more specific mode of carrying out the present invention further includes a level shift circuit (MN2, MN3) and third switches (SW3, SW4). The level shift circuit generates level shift output signals by which the level is shifted to the base electric potential side (earth potential side) than the internal source voltage (Vint) outputted to the voltage supply node (N1). The third switches (SW3, SW4) are connected between the level shift circuit (MN2, MN3) and the negative feedback input terminal of the error amplifier (Diff_Ampl) of the regulator (VReg). During the initial period (Tint) after the turning "on" of the external power supply, the control circuit (CNTRLR) controls the third switches (SW3, SW4) in either one of the on state or off state. The level shift output signals generated by the level shift circuit (MN2, MN3) are impressed to the negative feedback input terminal of the regulator (VReg) and a higher voltage (Vint) determined by the level shift voltage ($\Delta V$) of the level shift circuit (MN2, MN3) than the reference voltage (Vref) is generated in the voltage supply node (N1) during the initial period (Tint) after the turning "on" of the external power supply.

In other words, in a semiconductor integrated circuit according to another more specific mode of carrying out the present invention, the startup current generating circuit (LSCG) is structured so that the output current (Iref) of the startup current generating circuit (LSCG) may be effectively shut off after the passage of the initial period (Tint) following the turning "on" of the external power supply (see FIG. 11).

In other words, in a semiconductor integrated circuit according to a more specific mode of carrying out the present invention, the regulator (VReg) is constituted by any one of a series regulator, a switching regulator, or a switched capacity-type regulator. After the passage of the initial period (Tint) after the turning "on" of the external power supply, the voltage of the internal source voltage (Vint) supplied to the internal circuit (Int_Cir) is set by the operation of any one of these regulators (see FIG. 2, FIG. 11, FIG. 12, FIG. 13, FIG. 14 and FIG. 15).

According to the most specific mode of carrying out of the present invention, an external source voltage supply line (L_Vext) for supplying the external source voltage (Vext) to the power switch circuit (PSWC) is disposed encircling along the outer edge of the inside of the semiconductor chip, and a plurality of power switch circuits (PSWC) are disposed inside said external source voltage supply line (L_Vext) disposed in an encircling manner. An internal source voltage supply line (L_Vint) for supplying the internal circuit (CPU, NVM) with the internal source voltage (Vint) outputted from a plurality of power switch circuits (PSWC) is disposed encircling inside the external source voltage supply line (L_Vext) disposed in an encircling manner. And the internal circuit (CPU, NVM) is disposed inside the internal source voltage supply line (L_Vint) disposed in an encircling manner (see FIG. 16).

We will describe briefly the effects that can be obtained by the representative inventions among those disclosed in the present application as follows.

Specifically, according to the present invention, it is possible to provide a semiconductor integrated circuit wherein the value of the rush current flowing in the power switch circuit at the time of turning "on" of the power supply can be set with a high precision.

DESCRIPTION OF THE PREFERRED EMBODIMENTS

Circuit Structure of the Power Switch Circuit PSWC

Figure 1:
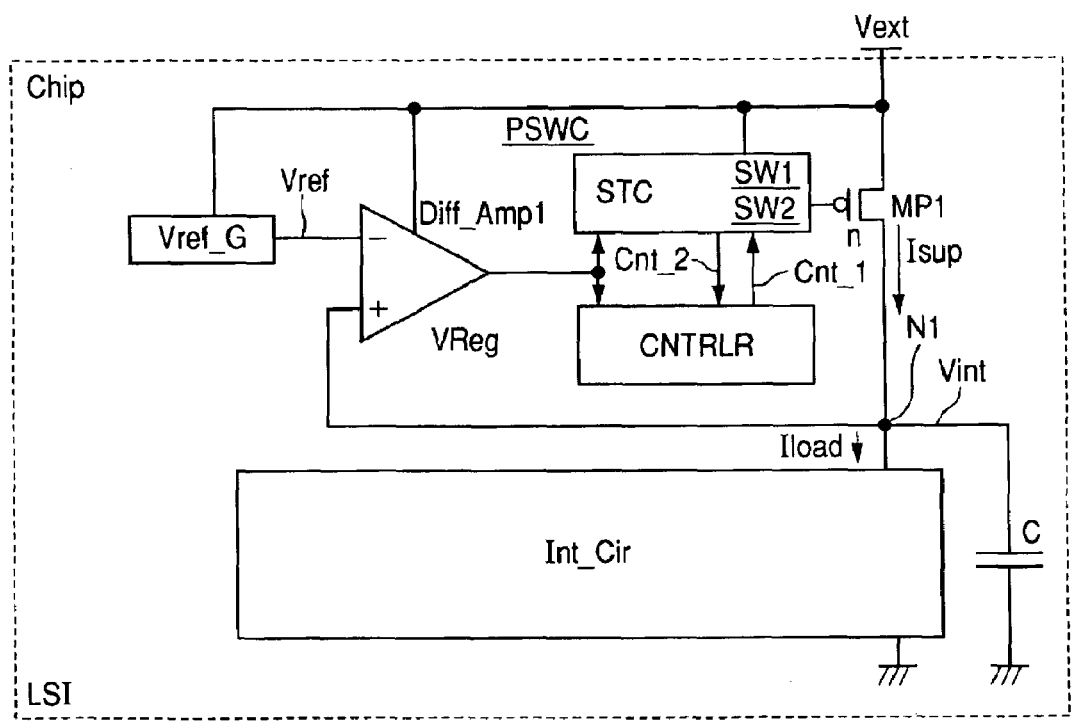
FIG. 1 is a diagram showing a circuit structure of the semiconductor integrated circuit according to a mode of carrying out of the present invention.

FIG. 1 is a schematic block diagram showing the circuitry of a semiconductor integrated circuit according to a mode of carrying out of the present invention including power switch circuits PSWC. Therefore, all the circuit elements such as power switch circuits PSWC and the like shown in FIG. 1 are formed over a silicon semiconductor chip. A silicon semiconductor chip Chip of semiconductor integrated circuit includes a power switch circuit PSWC that starts by responding to the control of the control circuit CNTRLR outputting the internal source voltage Vint to be supplied into the semiconductor chip from the external source voltage Vext supplied from outside of the semiconductor chip. Incidentally, the load capacitance C to which the internal source voltage Vint is supplied represents the sum of capacity obtained by adding the load capacitance and filtering capacity of the internal circuit Int_Cir within the semiconductor chip. The filtering capacity may be built-in in the semiconductor chip or may be an external element of the semiconductor chip. And the current source Iload represents the power consumption of the internal circuit Int_Cir within the semiconductor chip.

The power switch circuit PSWC starts outputting the internal source voltage Vint to be supplied into the semiconductor chip Chip from the external source voltage Vext supplied from outside of the semiconductor chip Chip. The power switch circuit PSWC includes an output transistor MP1, a start-up circuit STC, and a control circuit CNTRLR for controlling the start-up circuit STC. The output transistor MP1 is supplied with an external source voltage Vext and outputs an internal source voltage Vint. The start-up circuit STC controls the output transistor MP1 so that the output current Isup controlled to the predetermined value may flow into the output transistor MP1 during the initial period Tint following the turning "on" of the external source supply. In response to the turning "on" of the external source supply, the control circuit CNTRLR controls the start-up circuit STC. And the start-up circuit STC includes the first switch SW1, and this first switch SW1 is turned on by the control circuit CNTRLR in response to the turning "on" of the external power supply. As a result, the start-up circuit STC controls the output transistor MP1 so that the output current Isup flowing in the output transistor MP1 during the initial period Tint after the turning "on" of the external power supply may constitute effectively a constant increment as the time passes.

And the semiconductor chip Chip further includes a regulator VReg as an internal power supply circuit for generating the internal source voltage Vint supplied to the internal circuit Int_Cir out of the external source voltage Vext supplied thereto. Incidentally, the regulator VReg includes a reference voltage generating circuit Vref_G, an error amplifier Diff_Ampl, signal channel inside the start-up circuit STC, an output transistor MP1, and a negative feedback channel from the voltage supply node N1. The fact that the difference between the value of the internal source voltage Vint by the charge of the load capacitance C of the internal circuit Int_Cir due to the output current Isup of the output transistor MP1 controlled by the start-up circuit STC in the initial period Tint following the turning "on" of the external power supply and the value of the internal source voltage Vint generated by the regulator VReg is within the predetermined limit is detected by for example the error amplifier Diff_Ampl. The start-up circuit STC of the power switch circuit PSWC further includes a second switch SW2 between the outputs of the voltage supply node N1 and that of the regulator VReg. The voltage supply node N1 is supplied with either one of the voltages chosen from the internal source voltage Vint from the power switch circuit PSCW in the internal circuit Int_Cir and the internal source voltage Vint from the regulator VReg. Based on the detection result mentioned above, the increase in the output current Isup flowing in the output transistor MP1 for as the time passes is halted. Then, the control circuit CNTRLR controls the second switch SW2 into the on state so that the internal source voltage Vint generated by the regulator VReg may be supplied to the internal circuit Int_Cir. The internal source voltage Vint generated by the regulator VReg is supplied to the voltage supply node N1 as one of the voltages chosen.

Incidentally, in response to a power shutoff instruction signal, the control circuit CNTRLR turns off the output transistor MP1. Therefore, the total leak current including the sub-threshold leak current, the gate tunnel leak current and the like of the internal circuit Int_Cir can be controlled as the cutoff current of the output transistor MP1. In order to reduce this cutoff current, the channel length of the MOS transistor MP1 is also made sufficiently longer than that of the MOS transistor of the internal circuit Int_Cir, and the thickness of the gate insulating film of the MOS transistor MP1 is made sufficiently thicker than that of the MOS transistor of the internal circuit Int_Cir. And in response to a power on instruction signal, the control circuit CNTRLR causes an internal source voltage Vint in the range of 1-1.5V to be generated from an external source voltage Vext of 3.3-5V by the normal operation of the regulator VReg and the output transistor MP1. For this reason, the output transistor MP1 is designed to have a device structure sufficiently resistant to higher voltage than that of the MOS transistors of the internal circuit Int_Cir. Incidentally, the output transistor MP1 realizes both the function of supplying the output current Isup to the internal circuit Int_Cir by the control of the start-up circuit STC during the predetermined period Tint after the turning "on" of the power supply and the function of supplying the output current Isup to the internal circuit Int_Cir by the control of the regulator VReg after the passage of the predetermined period Tint after the turning "on" of the power. However, two output transistors may be used to realize both of these functions.

Figure 2:
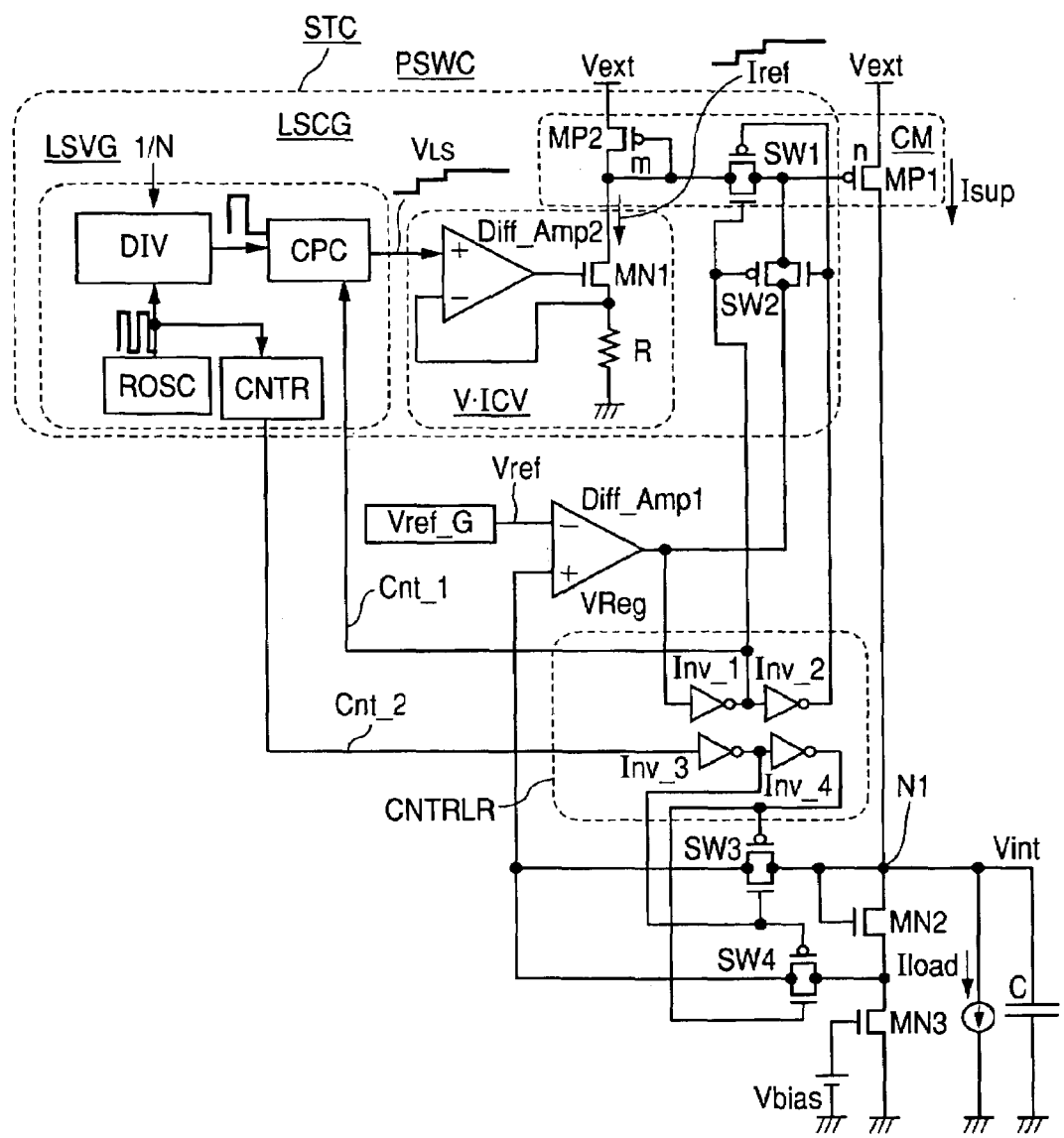
FIG. 2 is a diagram showing a more detailed circuit structure of the semiconductor integrated circuit according to a mode of carrying out of the present invention shown in FIG. 1.

FIG. 2 is a diagram showing the detailed circuit structure of the power switch circuit PSWC according to a specific embodiment of the present invention shown in FIG. 1. All the circuit elements of the power switch circuit PSWC shown in FIG. 2 are formed over a single silicon semiconductor chip. A silicon semiconductor chip of a semiconductor integrated circuit includes a power switch circuit PSWC for starting outputting the internal source voltage Vint to be supplied inside the semiconductor chip from the external source voltage Vext supplied from outside of the semiconductor chip. Incidentally, the total load capacitance C to which the internal source voltage Vint is supplied shows the total capacity of the load capacitance and the smoothing capacitor of the internal circuit Int_Cir inside the semiconductor chip. Furthermore, the current source Iload shows the current consumption of the internal circuit Int_Cir within the semiconductor chip.

The power switch circuit PSWC includes an output transistor MP1 for outputting an internal source voltage Vint out of an external source voltage Vext supplied thereto and a bias transistor MP2 for biasing the output transistor MP1 so that the output current controlled to the predetermined value at the time of turning "on" the power may flow in the output transistor MP1. The start-up circuit STC of the power switch circuit PSWC includes a first switch SW1 for relating the value of the current of the output transistor MP1 during the initial period Tint following the turning "on" of the external power in response to the control by the control circuit CNTRLR. And the control circuit CNTRLR includes four inverters Inv_1, Inv_2, Inv_3 and Inv_4. The start-up circuit STC of the power switch circuit PSWC includes further a startup current generating circuit LSCG. In response to the control of the control circuit CNTRLR, the startup current generating circuit LSCG generates an output current Iref of an approximately constant increment as the time passes during the initial period Tint following the turning "on" of the external power supply. Therefore, the output current Iref generated by the startup current generating circuit LSCG increases with a linear slope as the time passes. During the initial period Tint following the turning "on" of the external power, the startup current generating circuit LSCG supplies an output current Iref of an approximately constant increment regardless of the bias transistor MP2. In response to the control of the control circuit CNTRLR, during the initial period Tint following the turning "on" of the external power supply, the first switch SW1 is set in the on state and relates the current value Isup from the output transistor MP1 with the current value Iref of the bias transistor MP2. In other words, when the first switch SW1 is turned "on", the bias transistor MP2 and the output transistor MP1 start operating respectively as the input transistor and the output transistor of the current mirror circuit CM of the startup circuit STC. On the other hand, the startup current generating circuit LSCG includes a startup voltage generating circuit LSVG and a voltage current converting circuit V·ICV. The startup voltage generating circuit LSVG generates an output voltage VLS constituting an approximately constant increment during the initial period Tint following the turning "on" of the external power supply. Therefore, the output voltage VLS generated by the startup voltage generating circuit LSVG increases by a linear slope in relation to the time changes. Incidentally, the startup voltage generating circuit LSVG shown in FIG. 2 includes a ring oscillator ROSC, a divider DIV and a charge pump circuit CPC. During the initial period Tint following the turning "on" of the external power supply, the ring oscillator ROSC starts oscillating at the predetermined frequencies. The divider DIV starts dividing the signals of the predetermined frequencies received from the ring oscillator ROSC by the predetermined dividing ratio 1/N. Therefore, the divided outputs of lower frequencies than the frequencies oscillated by the ring oscillator ROSC are generated from the output of the divider DIV. The charge pump circuit CPC for impressing the divided output pulses from the output of the divider DIV increases the boosted voltage every time a pulse is impressed. In this way, the startup voltage generating circuit LSVG generates output voltages VLS with an approximately constant increment during the initial period Tint following the turning "on" of the external power supply. And the voltage current converting circuit V·ICV includes an operational amplifier Diff_Ampl, a N channel MOS transistor MN1 and resistances R. Output voltages VSL of an approximately constant increment are impressed to the non-inverting input terminal of the operational amplifier Diff_Ampl, and the source of N-channel MOS transistor MN1 and resistances R are connected to the inverting input terminal. The gate of the N channel MOS transistor MN1 is connected to the output terminal of the operational amplifier Diff_Ampl, and the current Iref of the drain of the N-channel MOS transistor MN1 is supplied to the current mirror circuit CM of the start-up circuit STC. Therefore, the operational amplifier Diff_Ampl and the N-channel MOS transistor MN1 function as voltage follower circuits. As a result, output voltages VLS of an approximately constant increment are applied to the both ends of resistances R, and an output current Iref of a relationship of the equation Iref=VLS/R flows in the resistances. Thus, the voltage current converting circuit V·ICV supplies an output current Iref of an approximately constant increment as the time passes to the current mirror circuit CM during the initial period after the turning "on" of the external power supply.

The power switch circuit PSWC includes a regulator VReg constituted by a reference voltage generating circuit Vref_G, an error amplifier Diff_Ampl, an output transistor MP1, and a second switch SW2. The error amplifier Diff_Amp1 compares the reference voltage Vref from the reference voltage generating circuit Vref_G and the internal source voltage Vint outputted by the output transistor MP1 and controls the conductivity of the output transistor MP1. The second switch SW2 is connected between the output terminal of the error amplifier Diff_Amp2 and the input terminal of the output transistor MP1. During the initial period Tint following the turning "on" of the external power supply, in response to the control by the control circuit CNTRLR, the first switch SW1 is turned "on" and the second switch SW2 is also turned "off". Therefore, supposing that the proportion between the size of the input transistor MP2 of the current mirror circuit CM and the size of the output transistor MP1 is m:n, an output current Isup with a relationship of equation Isup=(n/m)·Iref flows in the output transistor MP1. Thus, during the initial period Tint following the turning "on" of the external power supply, the value of the rush current of the output current Isup flowing in the output transistor MP1 is set with a high precision by an output current Iref constituting an approximately constant increment in relation to the passage of time supplied from the startup current generating circuit LSCG to the bias transistor MP2.

Figure 3:
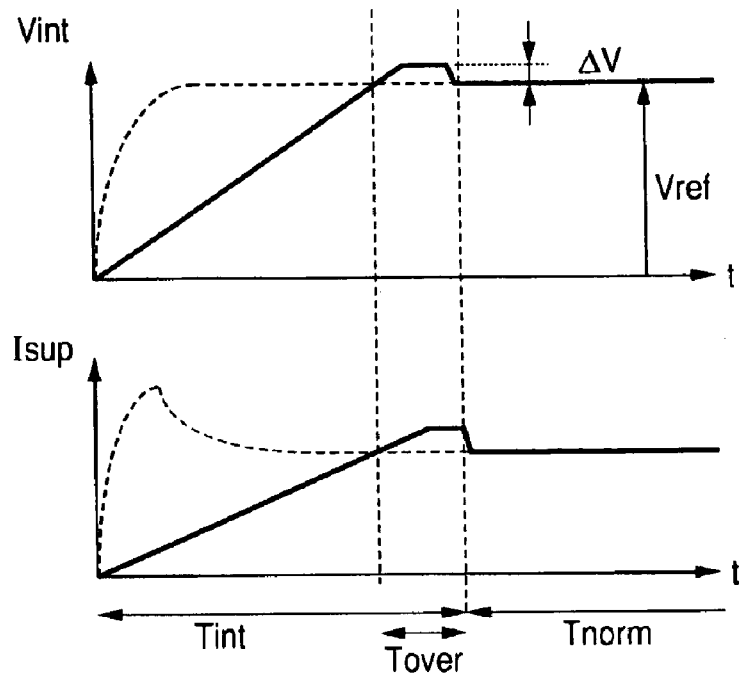
FIG. 3 is an illustration describing the operating characteristics of the semiconductor integrated circuit according to a mode of carrying out of the present invention shown in FIG. 1 and FIG. 2.

The solid line in the lower graph of FIG. 3 shows that the rush current of the output current Isup flowing in the output transistor MPI of the power switch circuit PSWC during the initial period Tint following the turning "on" of the external power supply is set with a high precision to be similarly approximately constant increment in relation to the time changes.

The power switch circuit PSWC further includes level shift circuits MN2, MN3 connected with the voltage supply node N1, the third switch SW3 and the fourth switch SW4 controlled by the control circuit CNTRLR. These level shift circuits MN2, MN3 generate level shift output signals whose level has shifted more towards the base potential side (earth potential side) than the internal source voltage Vint outputted in the voltage supply node N1. At an end of the third switch SW3, the internal source voltage int outputted from the output transistor MP1 to the voltage supply node N1 is impressed, and at an end of the fourth switch SW4 the level shift output of the level shift circuit MN2, MN3 is impressed. The other end of the third switch SW3 and the other end of the fourth switch SW4 are connected with the input terminal of negative feedback signals outputted by a regulator VReg constituted by an error amplifier Diff_Amp 2 and an output transistor MP1. Incidentally, the input terminal of negative feedback signals outputted by a regulator VReg constituted by an error amplifier Diff_Amp 2 and an output transistor MP1 serves as a non-inverting input terminal of the error amplifier Diff_Amp 2. If the negative feedback signal supplied to the non-inverting input terminal of the error amplifier Diff_Amp 2 falls below the level of the reference voltage Vref of the non-inverting input terminal, the potential of the output terminal of the error amplifier Diff_Amp 2 also falls to a low level.

The control circuit CNTRLR of the power switch circuit PSWC includes four inverters Inv_1, Inv_2, Inv_3 and Inv_4. The input of the inverter Inv_1 is connected with the output of the error amplifier Diff_Amp 1, and the output of the inverter Inv_1 is connected with the input of the inverter Inv_2. The input of the inverter Inv_3 is connected with the counter CNTR in the startup voltage generating circuit LSVG, and the output of the inverter Inv_3 is connected with the input of the inverter Inv_4. The control signal from the control circuit CNTRLR including four inverters Inv_1, Inv_2, Inv_3 and Inv_4 controls the switching on and off of the first switch SW1, the second switch SW2, the third switch SW3 and the fourth switch SW4. Immediately after the external power supply has been turned on, the output of the counter CNTR in the startup voltage generating circuit LSVG is at a high level. Therefore, the third switch SW3 and the fourth switch SW4 controlled by the inverters Inv_3 and Inv_4 in response to the high level output of this counter CNTR are respectively in the "off" state and in the "on" state. And immediately after the external power supply has been switched "on", the internal source voltage Vint of the voltage supply node N1 is at a very low level. Immediately after the external power supply has been switched "on", the reference voltage Vref has already been impressed on the non-inverting input terminal of the error amplifier Diff_Amp 1, and a low-level level shift voltage has been impressed on the non-inverting input terminal through the fourth switch SW4. Therefore, the output of the error amplifier Diff_Amp 1 has fallen to a low level. Therefore, the first switch SW1 and the second switch SW2 controlled by the inverters Inv_1 and Inv_2 in response to the low level of the error amplifier Diff_Amp 1 are respectively in the "on" state and the "off" state. Therefore, as the first switch SW1 is in the "on" state, an output current Isup of the relationship shown by the equation of Isup=(n/m) Iref flows in the output transistor MP1 from the current mirror circuit CM. As a result, in response to the output current Iref of an approximately constant increment in relation to the time change supplied from the startup current generating circuit LSCG to the bias transistor MP2, the output current Isup also constitutes an approximately constant increment.

The output current Isup of an approximately constant increment of the output transistor MP1 following the turning "on" of the external power supply charges the load capacitance C of the internal circuit Int_Cir. Therefore, as shown in the upper graph of FIG. 3, the internal source voltage Vint of the voltage supply node N1 rises by more or less constant increments. In response to the rise of this internal source voltage Vint, the level shift voltage from the level shift circuit MN2 and MN3 also rises. The voltage between both ends of the level shift element MN2 of the level shift circuit MN2, MN3 falls by ΔV. The voltage of Vint--ΔV impressed on the non-inverting input terminal of the error amplifier Diff_Amp 1 rises until the reference voltage Vref impressed on the non-inverting input terminal. Then, the output of the error amplifier Diff_Amp 1 changes from a low level to a high level, and the output of the inverter Inv_1 changes from a high level to a low level. This level change of the output of the inverter Inv_1 causes the impression of the divided signals from the divider DIV to the charge pump circuit CPC of the startup current generating circuit LSCG of the startup voltage generating circuit LSVG to halt. Therefore, any rise in the output voltage VLS of the charge pump circuit CPC is halted, and the output voltage VLS maintains an approximately fixed value. As a result of the output voltage VLS of the startup voltage generating circuit LSVG stays at an approximately fixed value, the output current Iref of the startup current generating circuit LSCG also stays at an approximately fixed value. Therefore, the output current Isup from the output transistor MP1 also stays at an approximately fixed value, and the internal source voltage Vint which is the charging voltage of the load capacitance C of the internal circuit Int_Cir also stays at an approximately fixed value. This state corresponds to the final period Tover of the initial period Tint following the turning "on" of the external power supply in the upper graph of FIG. 3. And due to a change to a high level of the output of the error amplifier Diff_Amp 1, the first switch SW1 changes from the "on" state to the "off" state, and the second switch SW2 changes from the "off" state to the "on" state. Because the second switch SW2 is in the "on" state, an output of the error amplifier Diff_Amp 1 controls the gate of the output transistor MP1. Therefore, the output of the internal source voltage Vint by the regulator VReg starts. On the other hand, by any timing of the final period Tover, the counter CNTR in the startup voltage generating circuit LSVC ends counting the predetermined number of oscillation pulses by the ring oscillator ROSC. Then, the output of the counter CNTR changes from a high level to a low level. In response to the level change to a low level of the output of the counter CNTR, the inverters Inv_3 and Inv_4 respectively controls the third switch SW3 to the "on" state and the fourth switch SW4 to the "off" state. As a result, through the third switch SW3 in the "on" state, the internal source voltage Vint of the voltage supply node N1 is applied to the non-inverting input terminal of the error amplifier Diff_Amp 1. Therefore, the regulator VReg starts controlling the negative feedback of the internal source voltage Vint, and the internal source voltage Vint ends up agreeing more or less with the reference voltage VReg. This state shows the normal operation wherein the regulator VReg generates the internal source voltage Vint during the period Tnorm after the passage of the initial period Tint following the turning "on" of the external power supply in the upper graph of FIG. 3. In other words, the solid line in the upper graph of FIG. 3 shows that the internal source voltage Vint rises to the point where the relationship of Vint≧Vref+ΔV is valid during the initial period Tint after the switching on of the external power supply and then the relationship of Vint=Vref is maintained during the period Tnorm after the passage of the initial period Tint following the turning "on" of the external power supply. During the period Tover in the latter half of the initial period Tint following the turning "on" of the external power supply, an overdrive operation wherein the internal source voltage Vint is higher than the reference voltage Vref by ΔV is realized, and the buildup of the internal source voltage Vint at the time of turning "on" the power supply is controlled. Thus, the final internal source voltage outputted for startup at the time of turning "on" the power supply turns out to be higher than the final internal source voltage outputted during the subsequent normal operation. By the subsequent normal operation, the internal source voltage is reduced to the value of the normal operation. Therefore, it is possible to bring the value of the internal source voltage outputted by the startup operation at the time of turning "on" the power close to the value of the internal source voltage outputted by the normal operation after the startup. The realization of overdrive operation with the internal source voltage Vint by ΔV during the period Tover results in the load capacitance C being sufficiently charged. During the period Tnorm after the passage of the initial period Tint following the turning "on" of the external power supply, the controller circuit CNTRLR controls respectively the first switch SW1 in the "off" state and the second switch SW2 in the "on" state. Therefore, the current value of the output current Isup outputted by the output transistor MP1 is controlled not by the current mirror circuit CM but by the output of the error amplifier Diff_Amp 2. As the load capacitance C has already been sufficiently charged, the current value of the output current Isup supplied from the output transistor MP1 agrees approximately with the current consumption Iload of the internal circuit in the semiconductor chip. If the current consumption Iload of the internal circuit increases and the internal source voltage Vint falls down, the error amplifier Diff_Amp 2 detects the fall of the internal source voltage Vint. Then, the error amplifier Diff_Amp 2 causes the current of the output current Isup supplied from the output transistor MP1 to increase, restores the internal source voltage Vint to the former value and maintains the internal source voltage Vint at an approximately stable value.

The solid line in the lower graph of FIG. 3 shows the output current Isup supplied from the output transistor MP1 before and after the passage of the initial period Tint following the turning "on" of the external power supply. Thus, during the initial period Tint following the turning "on" of the external power supply, the value of the rush current of the output current Isup flowing in the output transistor MP1 at the time of turning "on" the power is set at a high precision by the output current Iref of an approximately constant increment in relation to the passage of time supplied by the bias transistor MP2 from the startup current generating circuit LSCG. Incidentally, the broken lines in the upper and lower graphs of FIG. 3 show respectively changes in the output current Isup of the internal source voltage Vint in the case where a mode of carrying out the present invention is adopted. They show clearly that the rising speed of the internal source voltage Vint at the time of turning "on" the power is too fast, but also a large primary rush current flows for the output current Isup.

Incidentally, at the time of turning "on" the external power supply, the startup current generating circuit LSCG is supplied with at least either one of the external source voltage Vext and the power on control signal, and the startup current generating circuit LSCG starts operating. By this operation start, an output current Iref having an approximately constant increment is supplied to the current mirror circuit CM. On the other hand, it is possible to supply the startup current generating circuit LSCG with power off control signals. This will cause the startup current generating circuit LSCG to halt operating and reduce the power consumption of the startup current generating circuit LSCG to almost naught. In addition, it is possible to omit the counter CNTR of the startup current generating circuit LSCG shown in FIG. 3, and to connect a delaying circuit by the series connection of a plurality of inverters between the output of the inverter Inv_2 and the input of the inverter Inv_3. In this case also, it is possible to cause a change of the output of the error amplifier Diff_Amp 1 from a low level to a high level and, after the passage of a delay time of the delaying circuit mentioned above, to control respectively the third switch SW3 to be in the "on" state and the fourth switch SW4 to be in the "off" state.

Figure 4:
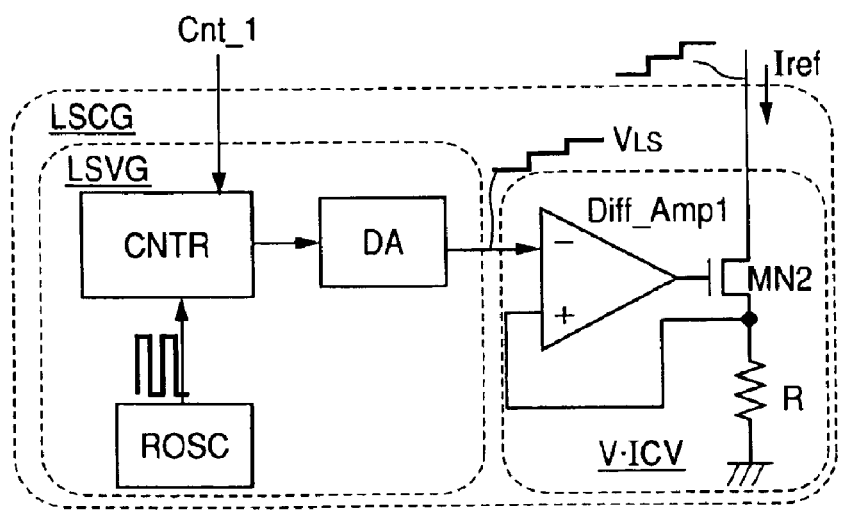
FIG. 4 is a circuit diagram of the startup current generating circuit LSCG according to another mode of carrying out.

Startup Current Generating Circuit LSCG According to Other Modes of Carrying Out FIG. 4 is a circuit diagram of the startup current generating circuit LSCG by another mode of carrying out. In the diagram, the startup current generating circuit LSCG includes a startup voltage generating circuit LSVG for generating an output voltage VLS of approximately constant increment during the initial period Tint following the turning "on" of the external power supply. The startup voltage generating circuit LSVG includes a ring oscillator ROSC, a counter CNTR for counting the oscillation clocks from the ring oscillator ROSC, and a D/A converter DA for converting the digital signals counted up by the counter CNTR to analog signals. Therefore, the output of the D/A converter DA constitutes an output voltage VLS of approximately constant increment during the initial period Tint following the turning "on" of the external power supply. This output voltage VLS is applied to the voltage current converting circuit V·ICV. Then, as shown in FIG. 3, an output current Iref having a relationship shown by the equation of Iref=VLS/R can be obtained from the voltage-current converting circuit V·ICV. In this way, in the voltage-current converting circuit V·ICV, an output current Iref constituting an approximately constant increment in relation to the passage of time during the initial period Tint following the turning "on" of the external power supply is supplied to the current mirror circuit CM of FIG. 3. When the control signal Cnt_1 changes from a low level to a high level, the counter CNTR stops counting up. Then, the output voltage VLS stops rising, and the output voltage VLS stays at an approximately constant value.

Figure 5:
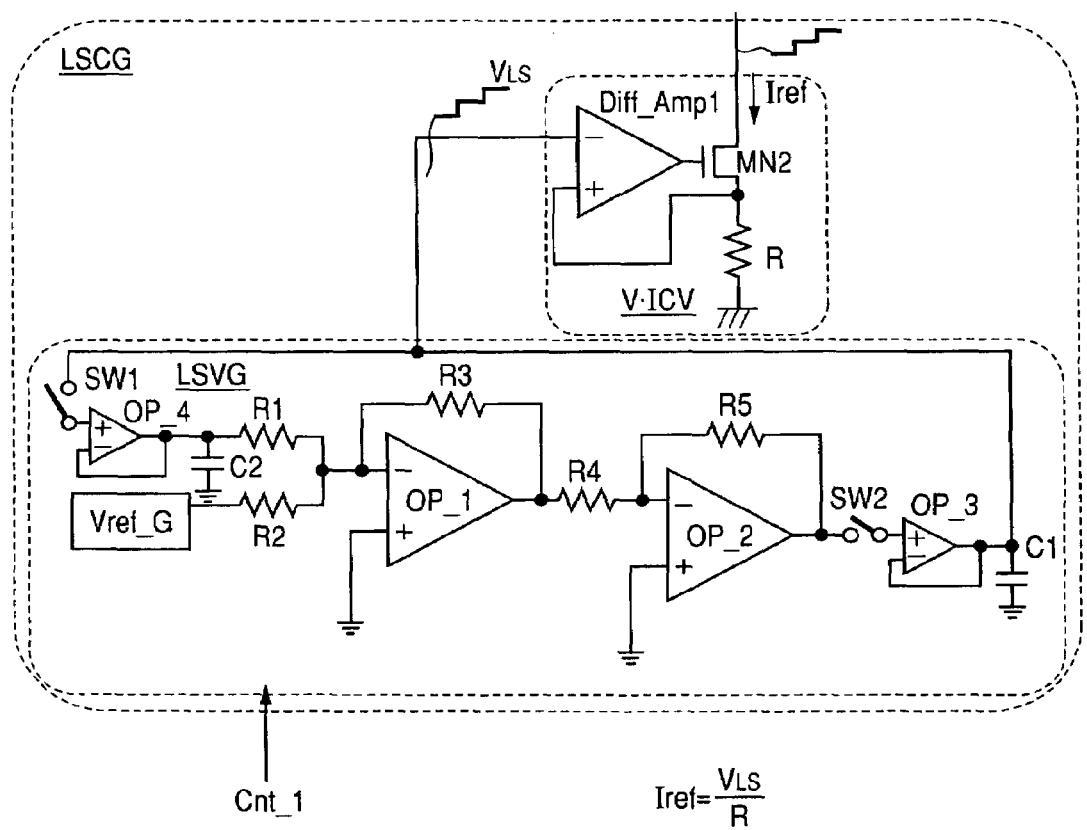
FIG. 5 is a circuit diagram of the startup current generating circuit LSCG according to another mode of carrying out.

FIG. 5 is a circuit diagram of the startup current generating circuit LSCG according to other mode of carrying out. In the figure, the startup current generating circuit LSCG includes a reference voltage generating circuit Vref_G, an analog adder, an analog inverter, an output sample holding circuit and a feedback input sample holding circuit. To begin with, the reference voltage generating circuit Vref_G generates an increase in voltage. The feedback input sample holding circuit includes a switch SW1, an operational amplifier OP_4 and a capacitance C2, and the initial voltage of the capacitance C2 is zero volts. The analog adder includes resistances having equal resistance value R1, R2 and R3 and an operational amplifier OP_1, and executes the first analog addition of the charging voltage of the capacitance C2 of the feedback input sample holding circuit and the increase in voltage of the reference voltage generating circuit Vref_G. By this analog addition, two analog input voltages impressed through the resistances R1 and R2 are added. By this addition, the polarity of the added output voltages is inversed to the two analog inputted voltages. Therefore, the analog inverter includes resistances R4 and R5 and an operational amplifier OP_2, and voltage gain is set at −1. The output sample holding circuit includes a switch SW2, an operational amplifier OP_3 and a capacitance C1, and the result of analog addition from the analog inverter is held as sample in the capacitance C1. After the first addition is completed, the result of the first addition is held as sample in the capacitance C2 of the feedback input sample holding circuit. The analog adder executes the second analog addition by adding the first addition result stored in the capacitance C2 and the additional divided voltage of the quasivoltage generating circuit Vref_G. The result of the second analog addition is sample held in the capacitance C1 of the output sample holding circuit. Thereafter, similar analog additions are repeated, and an output voltage VLS of an approximately constant increment is formed during the initial period Tint following the turning "on" of the external power supply in the capacitance of the output sample holding circuit. This output voltage VLS is inputted to the voltage current converting circuit V·ICV as shown in FIG. 3. When the control signal Cnt_1 changes from a low level to a high level, the analog adder stops adding. Then, the output voltage VLS stops rising, and the output voltage VLS stays at an approximately constant value.

Figure 6:
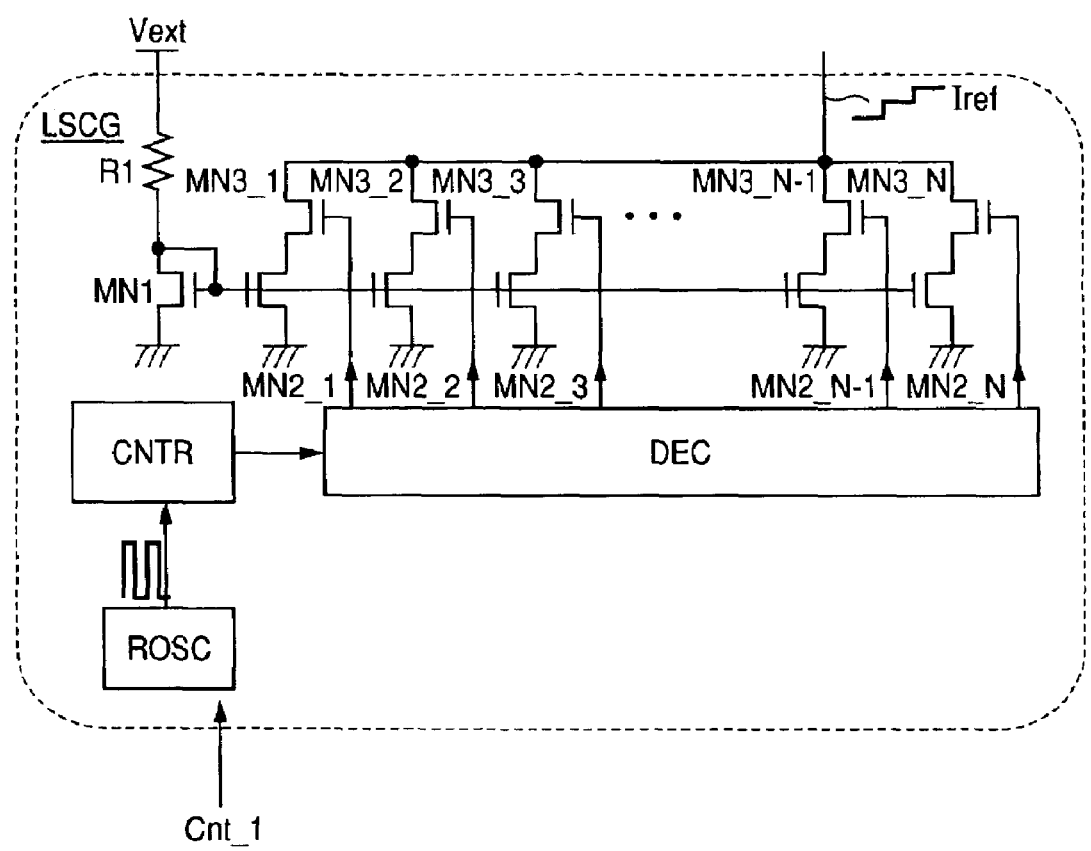
FIG. 6 is a circuit diagram of the startup current generating circuit LSCG according to another mode of carrying out.

FIG. 6 is a circuit diagram of a startup current generating circuit LSCG according to another mode of carrying out. In the figure, the startup current generating circuit LSCG includes a startup current generating circuit for generating an output current Iref with an approximately constant increment during the initial period Tint following the turning "on" of the external power supply. The startup current generating circuit LSCG includes a ring oscillator ROSC, a counter CNTR for counting the number of oscillation clocks received from the ring oscillator ROSC and a decoder DEC for decoding the digital signals counted up by the counter CNTR. When the count up of the counter CNTR progresses, changes from "0" to "1" from the left end to the right end progresses in a plurality of outputs of the decoder DE. A resistance R1 and an N-channel MOS transistor MN1 are in the input side circuit of the current mirror. The output side circuit of this current mirror includes a plurality of output side N-channel MOS transistors MN2_1, MN2_2, MN2_3, . . . MN2_N−1, MN2_N and a plurality of switches namely N-channel MOS transistor MN3_1, MN3_2, MN3_3, . . . MN3_N−1, MN3_N. The plurality of outputs of the decoder DEC are supplied to the gates of a plurality of switches namely N-channel MOS transistor MN3_2, MN3_3 . . . MN3_N−1, MN3_N. Therefore, an output current Iref with approximately constant increments is formed during the initial period Tint following the turning "on" of the external power supply from the commonly connected drains of a plurality of switches namely N-channel MOS transistors MN3_1, MN3_2, MN3_3, . . . MN3_N−1, MN3_N. This output current Iref is supplied to the current mirror circuit CM shown in FIG. 3. When the control signal. Cnt_1 changes from a low level to a high level, the counter CNTR stops counting up. Then, the output current Iref stops rising, and the output current Iref stays at an approximately constant value.

Figure 7:
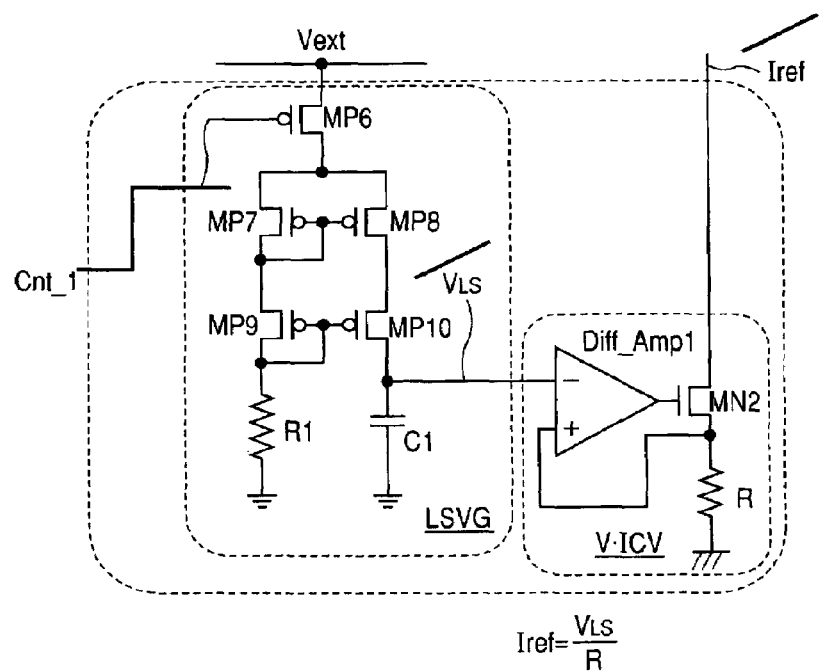
FIG. 7 is a circuit diagram of the startup current generating circuit LSCG according to another mode of carrying out.

FIG. 7 is a circuit diagram of a startup current generating circuit LSCG according to another mode of carrying out. In the figure, the startup current generating circuit LSCG includes a P-channel MOS transistor MP6 as a switch, a plurality of P-channel MOS transistors MP7-MP10 constituting current mirrors, a resistance R1 and a capacitance C1. The series connection of two diode-connected P-channel MOS transistors MP7 and MP9 mitigates the dependence on current and voltage of the output constant current of the current mirrors as a constant current circuit. The constant current supplied by the output side transistors MP8 and MP10 of the current mirrors charge the capacitance C1. Therefore, an output voltage VLS with an approximately constant increment during the initial period Tint following the turning "on" of the external power supply is formed at the capacitance C1. This output voltage VLS is applied to the voltage current converting circuit V·ICV similarly as shown in FIG. 3. Incidentally, when the control signal Cnt_1 of the gate of the P-channel MOS transistor MP6 changes from a low level to a high level, the P-channel MOS transistor MP6 is turned off. Then, the output voltage VLS stops rising, and the output voltage VLS stays at an approximately constant value.

Element Circuits Constituting the Startup Voltage Generating Circuit LSVG

Figure 8:
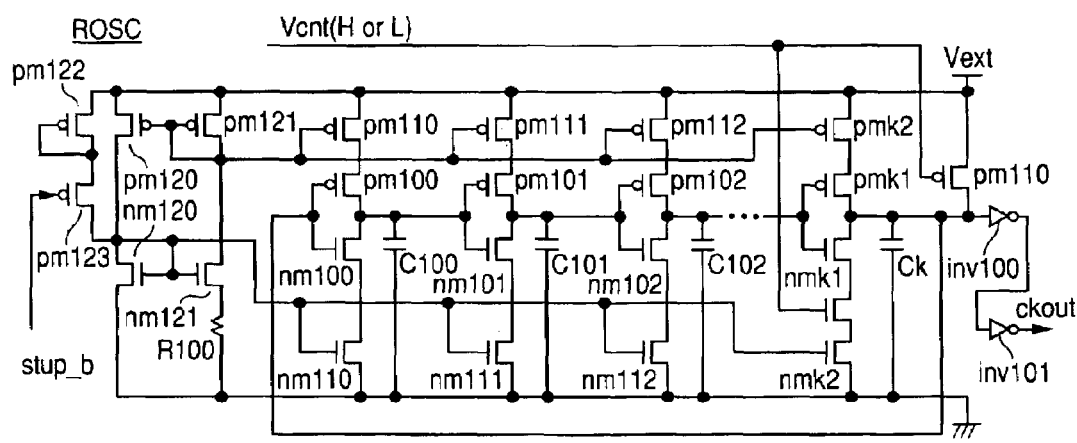
FIG. 8 is a circuit diagram of the ring oscillator ROSC, an element circuit for constituting the startup voltage generating circuit LSVG shown in FIG. 3.

FIG. 8 is the circuit diagram of a ring oscillator ROSC which is an element circuit for constituting the startup voltage generating circuit LSVG shown in FIG. 3. As the figure shows, the ring oscillator ROSC switches the start switch pm123 "on" with a start signal stup_b of a low level. Then, the startup current flows from the external source voltage Vext through a diode-connected pm122 and a start switch pm 123. P-channel MOS transistors pm120 and pm 121, N-channel MOS transistors nm 120 and nm 121, and a resistance R100 constitute a reference voltage and reference current generating circuit compensated against the fluctuations in the power source voltage and compensated against fluctuations in chip temperature. The startup current charges the gate capacitance of the N-channel MOS transistors nm 120 and nm 121 of the reference voltage and reference current generating circuit, and these N-channel MOS transistors nm 120 and nm 121 are turned on. As a result, the reference voltage and reference current generating circuit starts operating. A P-channel MOS transistor pm 100, an N-channel MOS transistor nm 100 and a capacitance C100 constitute the first-stage delay inverter. Similarly, a P-channel MOS transistor pm 101, an N-channel MOS transistor nm 101 and a capacitance C101 constitute the second-stage delay inverter. Similarly, a P-channel MOS transistor pm 102, an N-channel MOS transistor nm 102 and a capacitance C102 constitute the third-stage delay inverter. Thereafter similarly, a P-channel MOS transistor pmk1, an N-channel MOS transistor nmk1 and a capacitance Ck constitute the last-stage delay inverter. By the feedback of the output of this last-stage delay inverter to the input of the first-stage delay inverter, an oscillating loop circuit of the ring oscillator ROSC is constituted. The charging current and the discharging current of the capacitance of each inverter of a plurality of stages of delay inverters of the oscillating loop circuit of the ring oscillator ROSC are respectively stably set by the stable current of the P-channel MOS transistor pm 121 and the stable current of the N-channel MOS transistor nm 121 of the reference voltage and reference current generating circuit. As a result, the generating frequency of the ring oscillator ROSC is compensated against fluctuations in current and voltage and is also compensated against changes in the chip temperature.

Figure 9:
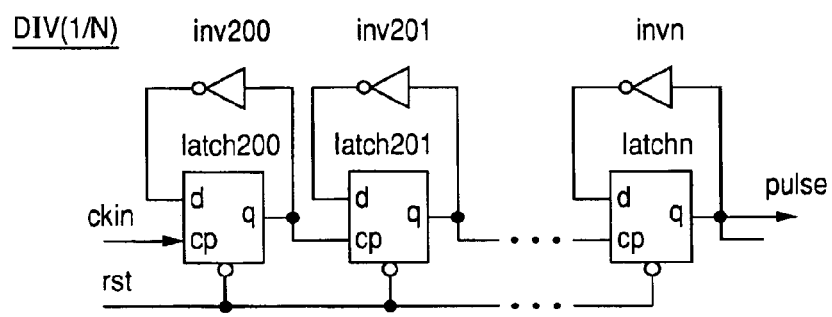
FIG. 9 is a circuit diagram of the divider DIV, an element circuit for constituting the startup voltage generating circuit LSVG shown in FIG. 3.

FIG. 9 is a circuit diagram of a divider DIV representing an element circuit for constituting the startup voltage generating circuit LSVG shown in FIG. 3. As the figure shows, the divider DIV includes a plurality of latches latch 200 ... latch n having data input d, clock input cp, data output q, a reset terminal rst, and a plurality of inverters inv 200 ... inv n. The clock input cp of the first-stage latch 200 is supplied with the oscillating clock ckin of the ring oscillator ROSC to be divided. The data output q of the first-stage latch 200 is supplied to the data input d of the first-stage latch 200 through the inverter inv 200, and is supplied at the same time to the clock input cp of the second-stage latch 201. The data output q of the second-stage latch 201 is supplied to the data input d of the second-stage latch 201 through the inverter inv 201, and is supplied at the same time to the clock input cp of the third-stage latch (not shown). Thereafter similarly, the data output q of the last stage latch n is supplied to the data input d of the last-stage latch n through the inverter inv n. Thus, the data output q of the last-stage latch n will be a divided output pulse.

Figure 10:
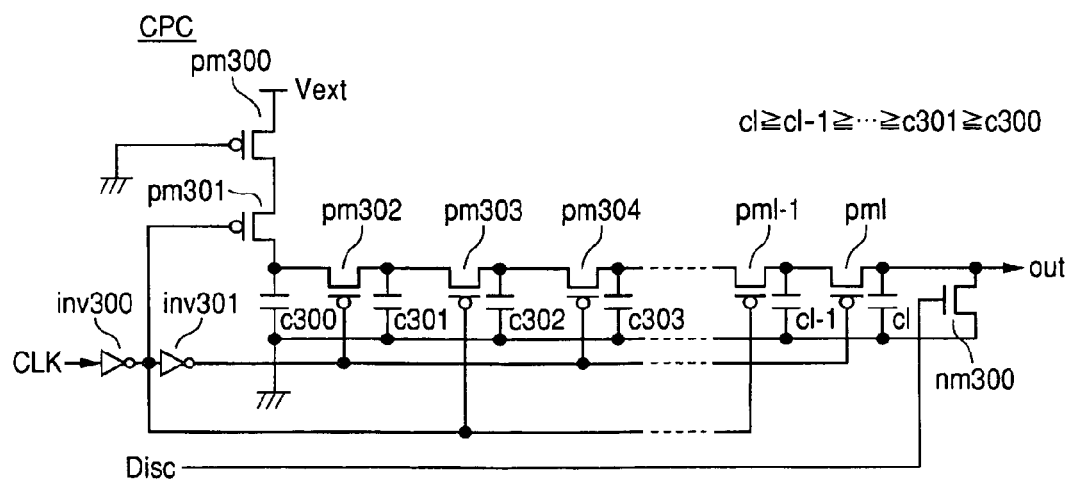
FIG. 10 is a circuit diagram of the charge pump circuit CPC, an element circuit for constituting the startup voltage generating circuit LSVG shown in FIG. 3.

FIG. 10 is a circuit diagram of a charge pump circuit CPC representing an element circuit constituting the startup voltage generating circuit LSVG shown in FIG. 3. As the figure shows, the charge pump circuit CPC includes inverters inv 300 and inv 301 for responding the clock signals CKL, a P-channel MOS transistor pm 300 as a constant current source, a plurality of P-channel MOS transistors pm 301, pm 302, pm 303, pm 304 ... pml-1, pml as switches. And the charge pump circuit CPC further includes a plurality of capacitances C300, C301, C302, c303 ... C1-1, C1 and discharging N-channel MOS transistor nm 300 that turns on by the discharge indication signal Disk.

When the clock signal changes from a low level to a high level, the output of the inverter inv 300 falls down to a low level, pm 301 turns "on" and the first electric charge is sampled in the first-stage capacitance C300. Then, when the clock signal CLK changes from a high level to a low level, the output of the inverter inv 300 rises to a high level, pm 301 is turned "off" and the output of the inverter inv 301 falls to a low level, and pm 302 turns "on." Then, most of the first electric charge of the first-stage of the capacitance C 300 is transferred to the second-stage capacitance C301. Then, when the clock signal CLK changes from a low level to a high level, the output of the inverter inv 300 falls to a low level, pm 301 is turned "on" and the second electric charge is sampled in the first-stage capacitance C300. At this time, the output of the inverter inv 301 rises to a high level and PM 302 is turned "off." As the output of the inverter inv 300 is at a low level, pm 303 is also turned "on" and most of the first electric charge that has been transferred to the second-stage capacitance C301 is transferred to the third-stage capacitance C 302. Then, when the clock signal CLK is changed from a high level to a low level, the output of the inverter inv 300 rises to a high level, pm 301 is turned "off" and the output of the inverter inv 301 falls down to a low level, and PM 302 is turned "on." Then, most of the second electric charge of the first-stage capacitance C300 is transferred to the second-stage capacitance C301. Because of the low-level output of the inverter inv 301, pm 304 is in the "on" state. Most of the first electric charge that had been transferred to the third-stage capacitance C 302 is transferred to the fourth-stage capacitance C 303. Then, when the clock signal CLK changes from a low level to a high level, the output of the inverter inv 300 falls down to a low level, pm 301 is turned "on" and the third electric charge is sampled in the first-stage capacitance C300. At this time, the output of the inverter inv 301 is at a high level, and pm 302 is turned "off." Because of the low-level output of the inverter Inv 300, pm 305 (not shown) is in the "on" state. Most of the first electric charge that had been transferred to the fourth-stage capacitance C303 is transferred to the fifth-stage capacitance C304 (not shown). As pm 303 is also in the "on" state at this time, most of the second electric charge that had been transferred to the second-stage capacitance C301 is transferred to the third-stage capacitance C302. Due to the repetition of transfer operations of electric charge as mentioned above, consecutively sampled electric charges in the first-stage capacitance C300 are accumulated in the last-stage capacitance C1. As a result, a boosted voltage out can be obtained from the last-stage capacitance C1.

Figure 11:
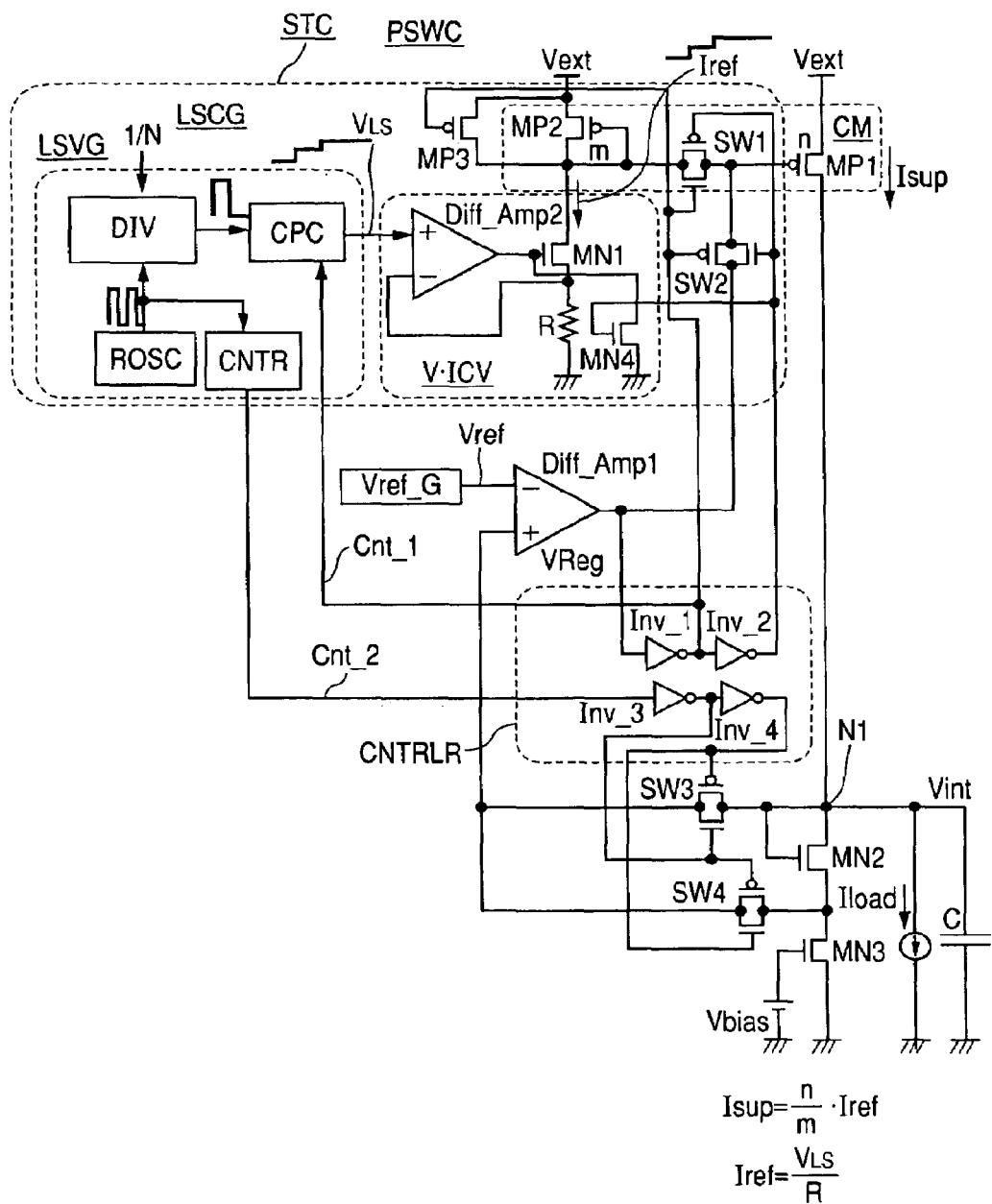
FIG. 11 is a diagram showing the circuit structure of the power switch circuit PSWC according to another mode of carrying out the present invention.

Circuit Structure of a Power Switch Circuit PSWC by Another Mode of Carrying Out FIG. 11 is a diagram showing the circuit structure of a power switch circuit PSWC by another mode of carrying out the present invention. We will describe below the differences between the mode of carrying out shown in FIG. 11 and the mode of carrying shown in FIG. 2.

In FIG. 11 an N-channel MOS transistor MN4 and a P-channel MOS transistor MP3 absent in FIG. 2 are added. The gate of the N-channel MOS transistor MN4 is connected with the output of the inverter IN2 of the power switch circuit PSWC, and the drain source channel of a N-channel MOS transistor MN4 is connected between the gate of a N-channel MOS transistor MN1 of the voltage current converting circuit V·ICV of the startup current generating circuit LSCG and the earth potential. The gate of a P-channel MOS transistor MP3 is connected with the output of an inverter Inv_1 of the controller circuit CNTRLR, the source drain channel of a P-channel MOS transistor MP3 is connected in parallel with the source drain channel of a diode-connected P-channel MOS transistor MP2 of a current mirror circuit CM. When the output of an error amplifier Diff_Amp 1 changes from a low level to a high level, due to the output of an inverter IN2, the N-channel MOS transistor MN4 turns "on." Then, the N-channel MOS transistor MN1 releasing an output current Iref turns "off" and can achieve a low power consumption. At the same time, thanks to the output of the inverter IN1, the P-channel MOS transistor MP3 turns "on." Then, the output transistor MP1 letting out the output current Isup can be surely turned "off".

Figure 12:
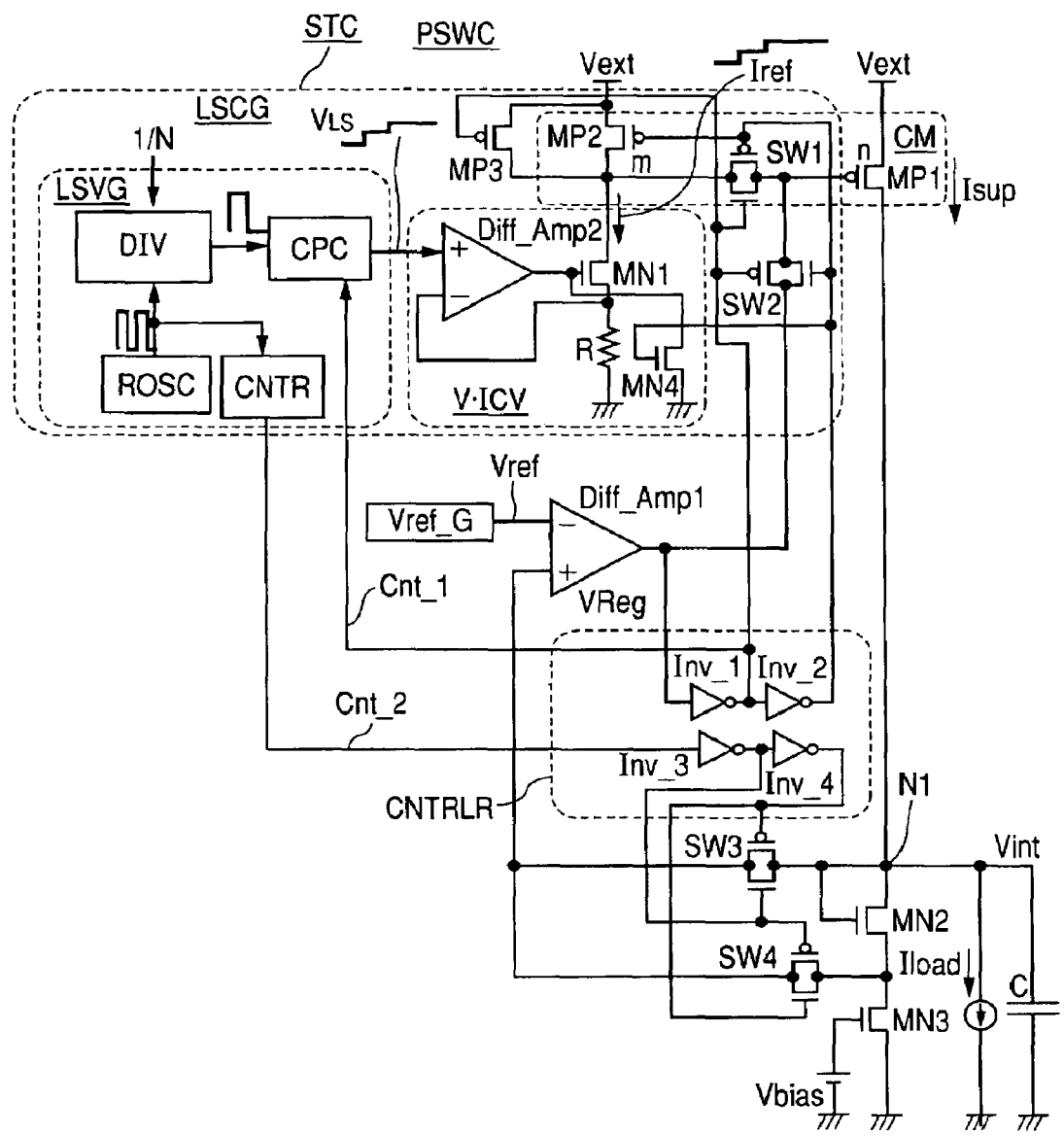
FIG. 12 is a diagram showing the circuit structure of the power switch circuit PSWC according to another mode of carrying out the present invention.

FIG. 12 is a diagram showing the circuit structure of a power switch circuit PSWC according to another mode of carrying out of the present invention. We will describe below the differences between the mode of carrying out shown in FIG. 12 and that shown in FIG. 11.

In FIG. 12, the difference is that a P-channel MOS transistor MP2 serving as the bias transistor of the current mirror circuit CM to which the output current Iref with an approximately constant increment of the voltage current converting circuit V·ICV of the startup current generating circuit LSCG is supplied is not diode-connected. During the initial period Tint following the turning "on" of the external power supply, the gate of this P-channel MOS transistor MP2 is controlled by the low-level output of the inverter INV2 of the controller circuit CNTRLR and is in the "on" state. Due to a voltage drop resulting from the output current Iref through a relatively high "on" resistance in the source drain channel of a P-channel MOS transistor MP2 in the "on" state, the P-channel MOS transistor MP1 serving as an output transistor is biased between its source and gate.

Figure 13:
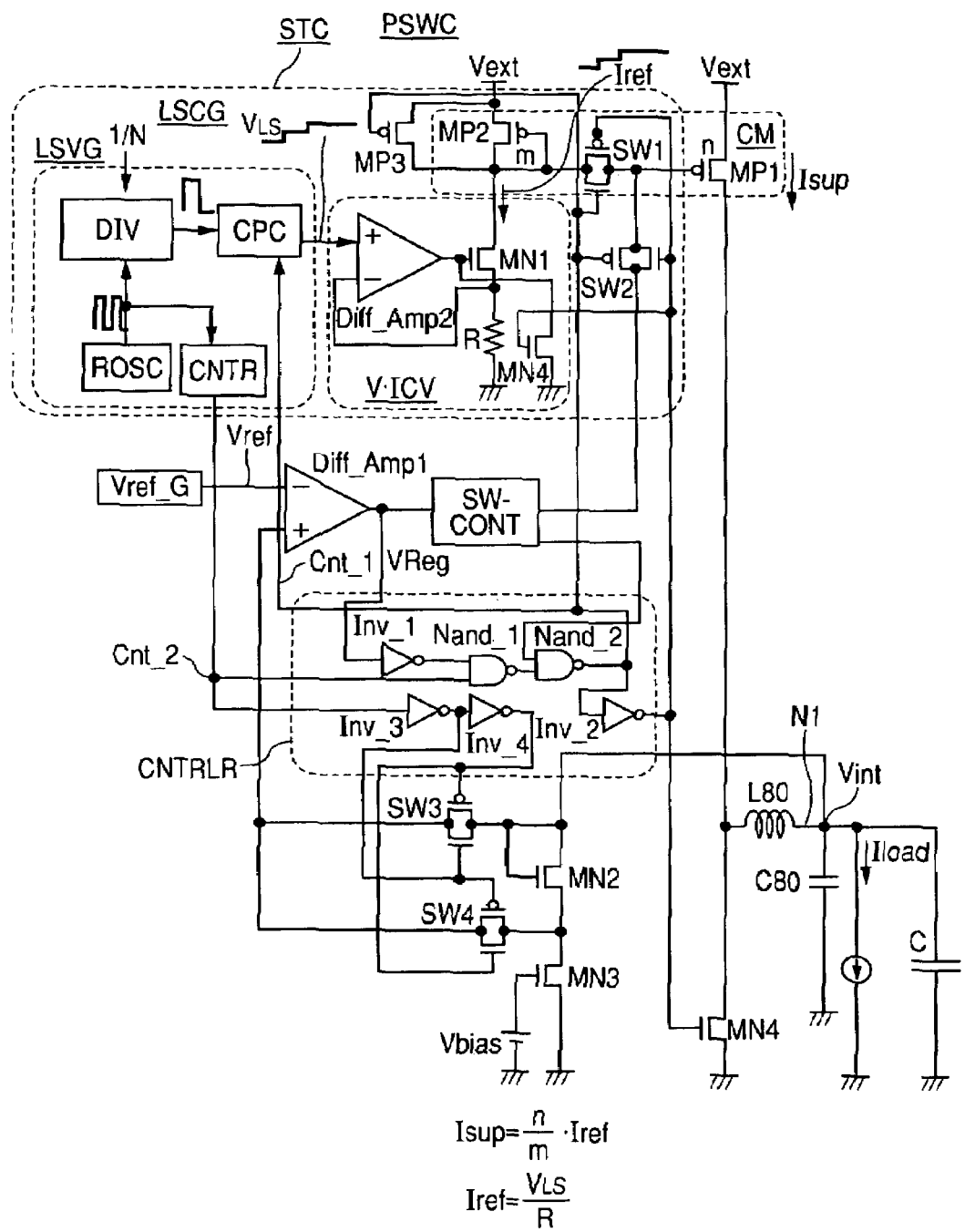
FIG. 13 is a diagram showing the circuit structure of the power switch circuit PSWC according to another mode of carrying out the present invention.

FIG. 13 is a diagram showing the circuit structure of a power switch circuit PSWC according to another mode of carrying out of the present invention. The power switch circuit PSWC shown in FIG. 13 is not a series regulator we have described so far, but is a stabilizing power circuit by a switching regulator. A smoothing capacitor including a coil L80 and a capacitance C80 is connected between the drain and the load of the P-channel MOS transistor MP1 which is an output transistor of the switching regulator shown in FIG. 13, and the drain of the MP1 is connected with the drain of another output transistor namely N-channel MOS transistor MN4. The output of the error amplifier Diff_Amp 2 is connected with the input of the switching controller SW-CNT. The switching controller SW·CNT drives the gates of two output transistors MP1 and MN4 so that an output transistor namely a P-channel MOS transistor MP1 and another output transistor namely a N-channel MOS transistor MN4 may be alternatively in the "on" state. As a result, an internal source voltage Vint proportional to the ratio of the "on" period of an output transistor namely P-channel MOS transistor MP1 and the "on" period of another output transistor namely N-channel MOS transistor MN4 is generated. In FIG. 13 also, the control circuit CNTRLR, the startup current generating circuit LSCG, the first switch SW1 and the second switch SW2 of the current mirror circuit CM, the error amplifier Diff_Amp 1 and the like operate more or less in the same way as the mode of carrying out shown in FIG. 11.

Figure 14:
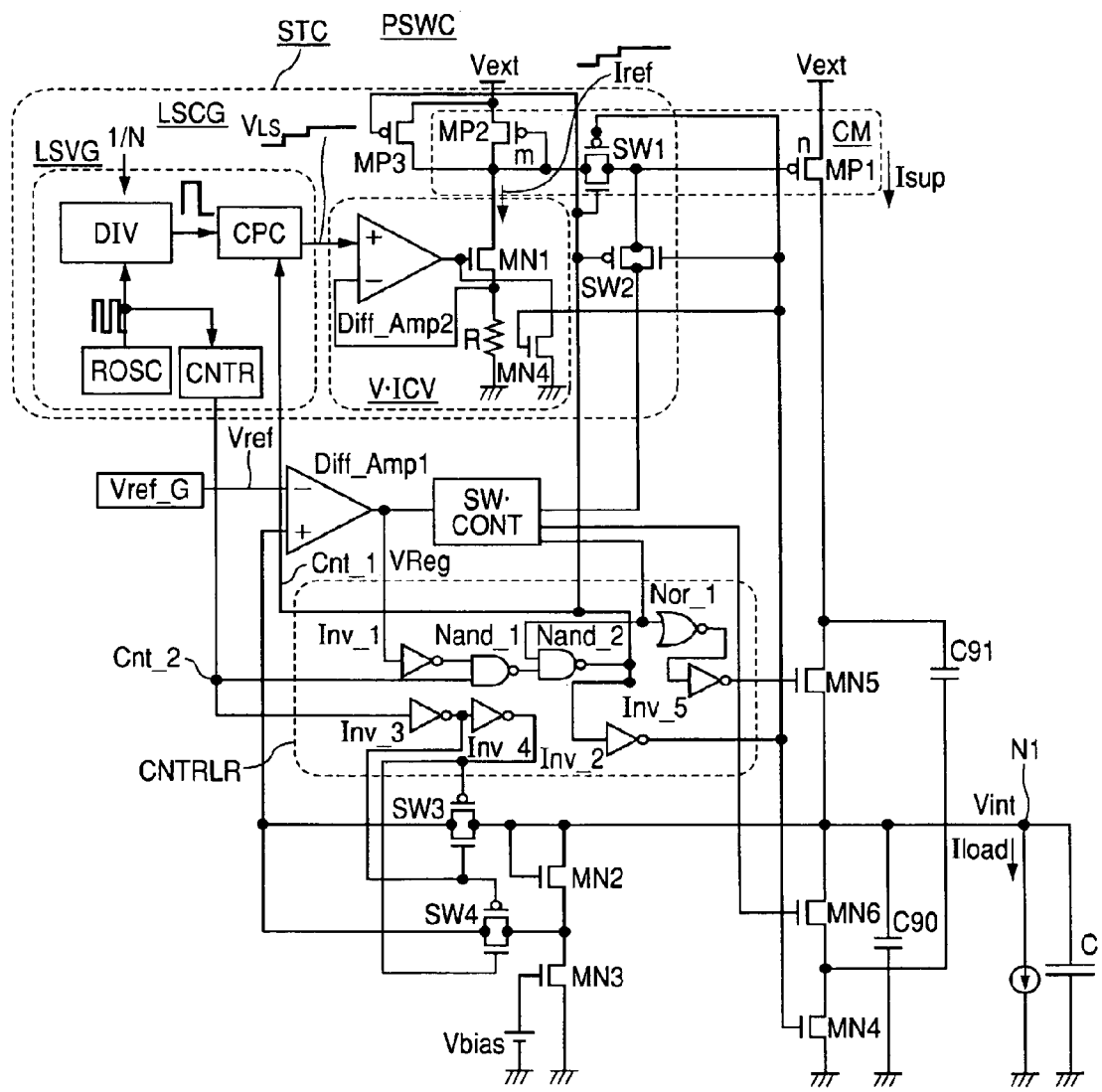
FIG. 14 is a diagram showing the circuit structure of the power switch circuit PSWC according to still another mode of carrying out the present invention.

FIG. 14 is a diagram showing the circuit structure of a power switch circuit PSWC according to another mode of carrying out of the present invention. The power switch circuit PSWC shown in FIG. 14 is not a series regulator either, but is a stabilizing power circuit by a switched capacitor-type regulator. The drain of the output transistor of the switched capacitor-type regulator shown in FIG. 14 namely P-channel MOS transistor MP1 is connected with N-channel MOS transistors MN5, MN6 and MN4 and two capacitances C90 and C91. The switching controller SW·CONT controls in the first place a P-channel MOS transistor MP1 and N-channel MOS transistor MN6 to be in the "on" state, and controls N-channel MOS transistors MN5 and MN4 to be in the "off" state. Then, the two capacitances C90 and C91 are charged between the external source voltage Vext and the earth potential in the series connected state. Then, the switching controller SW·CONT controls the P-channel MOS transistor MP1 and the N-channel MOS transistor MN6 to be in the "off" state and controls the N-channel MOS transistors MN5 and MN4 to be in the "on" state. Then, the two capacitances C90 and C91 discharge the electric load in the parallel connected state to the load between the internal source voltage Vint and the earth potential. In FIG. 14 also, the control circuit CNTRLR, the startup current generating circuit LSCG, the first switch SW1 and the second switch SW2 of the current mirror circuit CM, the error amplifier Diff_Amp1 and the like operate more or less in the same way as the mode of carrying out shown in FIG. 11.

Figure 15:
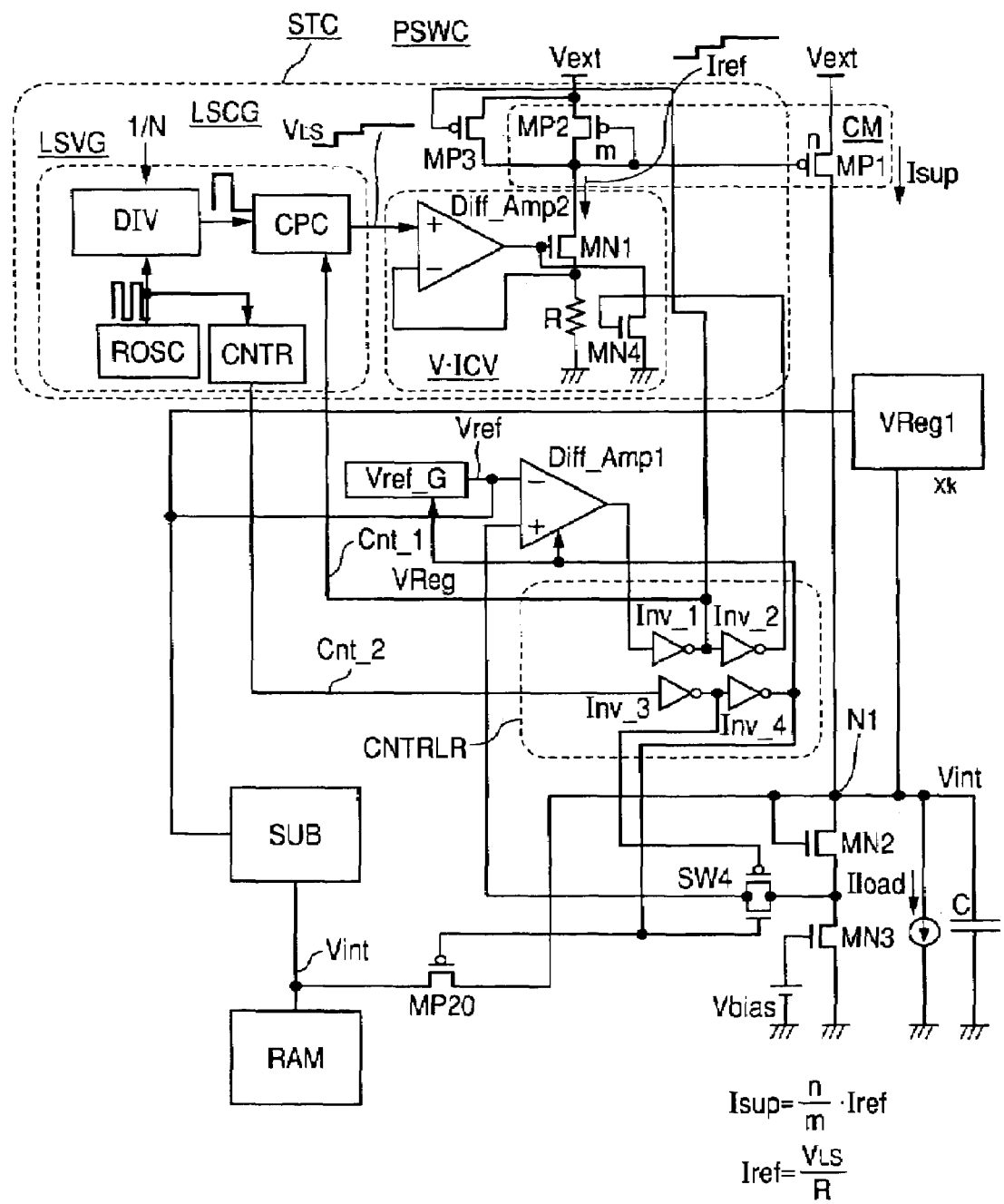
FIG. 15 is a diagram showing the circuit structure of the power switch circuit PSWC according to still another mode of carrying out the present invention.

FIG. 15 is a diagram showing the circuit structure of a power switch circuit PSWC according to another mode of carrying out of the present invention. The power switch circuit PSWC shown in FIG. 15 is not a stabilizing power circuit, but is also a power switch for controlling the rush current at the time of turning "on" the power and for building up the internal source voltage Vint. In the figure, a static random access memory SRAM serving as the built-in memory of the semiconductor integrated circuit is supplied with the internal source voltage Vint from the sub series regulator SUB for super low power consumption for normal operation. At the time of turning "on" the power, the power switch circuit PSWC controls the rush current and build up the internal source voltage Vint at a high speed. At this time, the other output transistor namely P-channel MOS transistor MP20 connected with the static random access memory SRAM and a sub series regulator SUB is controlled to be in the "off" state. During the initial period Tint following the turning "on" of the external power supply, the output of the inverter INV1 is at a high level and the output of the inverter INV2 is at a low level. Therefore, an output current Iref with an approximately constant increment outputted by the voltage current converting circuit V·ICV of the startup current generating circuit LSCG is supplied to a P-channel MOS transistor MP2 serving as a diode-connected bias transistor of the current mirror circuit CM. Therefore, the value of the current Isup supplied from a P-channel MOS transistor MP1 serving as an output transistor is controlled with a high precision and controls large rush current. Before the counter CNTR inside the startup voltage generating circuit LSVG reaches the predetermined number of counts of the oscillation pulses generated by the ring oscillator ROSC, the output of the counter CNTR is at a high level. Therefore, the inverters Inv_3 and Inv_4 maintain the switch SW4 in the "on" state. Therefore, through the switch SW4 in the "on" state, the output voltage Vint from the level shift element MN2−ΔV is applied to the non-inverted input terminal of the error amplifier Diff_Amp1. Therefore, when the voltage of Vint−ΔV applied to the non-inverted input terminal of the error amplifier Diff_Amp1 rises to a level a little lower than the reference voltage Vref impressed in the non-inverted input terminal, the internal source voltage Vint supplied to the load is built up to a level close to approximately Vref+ΔV. In this state, when the counter CNTR inside the startup voltage generating circuit LSVG completes the predetermined number of counts of the oscillation pulses produced by the ring oscillator ROSC, the output of the counter CNTR changes from a high level to a low level. Then, the inverters Inv_3 and Inv_4 control the other output transistor connected with a static random access memory SRAM and sub-series regulator SUB namely the P-channel MOS transistor MP20 from the "off" state to the "on" state. As a result, the internal source voltage Vint to be supplied for load built up to a level close to approximately Vref+ΔV is supplied to the static random access memory SRAM and the sub-series regulator SUB through the P-channel MOS transistor MP20. In this way, the lack of startup load driving power of the static random access memory SRAM at the time of turning "on" the power for the super low power consuming sub-series regulator SUB can be supplemented by the power switch circuit PSWC. Thereafter, the voltage of Vint−ΔV impressed on the non-inverted input terminal of the error amplifier Diff_Amp1 rises to the reference voltage Vref impressed on the non-inverted input terminal. Then, like the mode of carrying out described in FIG. 11, the output of the error amplifier Diff_Amp1 changes from a low level to a high level, and the output of the inverter INV1 falls down to a low level and the output of the inverter INV2 rises to a high level. Therefore, both the N-channel MOS transistor MN4 and the P-channel MOS transistor MP3 change from the "off" state to the "on" state. Therefore, the N-channel MOS transistor MN1 of the voltage current converting circuit V·ICV of the startup current generating circuit LSCG is turned "off" and the diode-connected P-channel MOS transistor MP2 of the current mirror circuit CM is made inactive. Incidentally, the output of the inverter Inv_2 changes from a low level to a high level. In response to this change, after the predetermined delay time, it is possible to stop the operation of the reference voltage generating circuit Vrel_G and the error amplifier Difff_Amp1 constituting the startup regulator VReg and to make the whole system less power consuming. In addition, the value of current supplied Isup from the output transistor namely P-channel MOS transistor MP1 is reduced to approximately to nil, and at this time the static random access memory SRAM is supplied with the internal source voltage Vint from the regularly operating super low power consuming sub-series regulator SUB. Incidentally, as shown in FIG. 15, another regulator VReg 1 may be connected in parallel with the startup regulator VReg. The other regulator VReg is designed to consume a little more power than the super low power consuming sub-series regulator SUB, but consumes considerably less power than the startup regulator VReg. It is recommended that at the time of turning "on" the power, at first the startup regulator VReg would be started, followed by the startup of the other regulator VReg1, and then a P-channel MOS transistor MP20 would be turned "on". Incidentally, according to the mode of carrying out described in FIG. 15, the voltage Vint of Vint−ΔV impressed on the non-inverted input terminal is set to agree more or less with the internal source voltage Vint from the super low power consuming sub-series regulator SUB. This agreement can be realized by harmonizing the internal source voltage Vint outputted during normal operation from the super low power consuming sub-series regulator SUB with the reference voltage Vref from the reference voltage generating circuit Vref_G.

Figure 16:
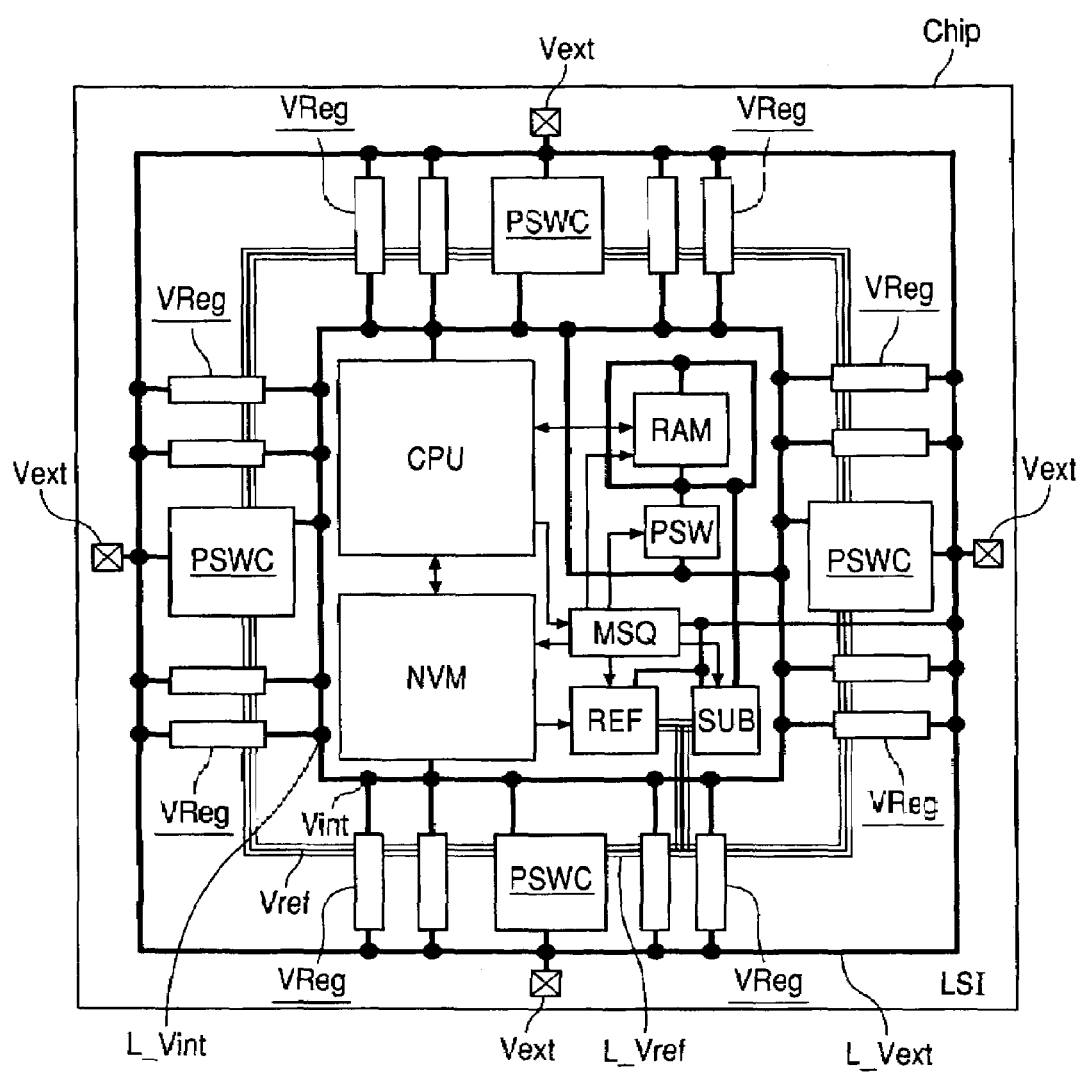
FIG. 16 is a top plan layout view of a semiconductor chip according to the most specific mode of carrying out the present invention.

FIG. 16 is a top plan layout of a semiconductor chip according to the most specific mode of carrying out of the present invention. As the figure shows, an external source voltage supply line L_Vext supplying an external source voltage Vext to, for example, a power switch circuit PSWC shown in FIG. 11 is disposed encircling along the outer edge of the inside of the semiconductor chip. Inside the external source voltage supply line L_Vext disposed encircling, for example four power switch circuits PSWC shown in FIG. 11 are disposed. Inside the external source voltage supply line L_Vext disposed in an encircling manner, the internal source voltage supply line L_Vint supplying the internal circuit CPU and NVM with the internal source voltage Vint outputted from four power switch circuits PSWC is disposed in an encircling manner. Inside the internal source voltage supply line L_Vint disposed in an encircling manner, the internal circuit CPU and NVM are disposed. The internal circuit includes a central processing unit CPU, a non-volatile memory NVM, and a main sequencer MSQ. a hand gap reference voltage generating circuit REF, a static random access memory SRAM as a built-in memory of the semiconductor integrated circuit, a sub super low power consuming series regulator SUB for SRAM shown in FIG. 15, and a power switch PSW for SRAM. Incidentally, between the external source voltage supply line L_Vext disposed in an encircling manner outside and the internal source voltage supply line L_Vint disposed in an enclosing manner inside, a reference voltage supply line L_Vref for supplying the internal circuit with the reference voltage Vref is disposed in an encircling manner. In addition, between the external source voltage supply line L_Vext disposed in an encircling manner outside and the internal source voltage supply line L_Vint disposed in an enclosing manner inside, 16 other regulators VReg1 are disposed as relatively low power consuming stabilizing power circuits as shown in FIG. 16.

We have described specifically the present invention made by the inventors with reference to embodiments. However, the present invention is not limited to the above descriptions, and it is needless to say that various modifications are possible to the extent that they do not deviate from the spirit and object of the present invention.

For example, in the mode of carrying out described in FIG. 3 and the like, the P-channel MOS transistor and the N-channel MOS transistor may be respectively replaced by a PNP-type bipolar transistor and a NPN-type bipolar transistor.

What is claimed is:

1. A semiconductor integrated circuit comprising:
   power switch circuit means for starting the output of an internal source voltage to be supplied to a semiconductor chip from an external source voltage supplied from outside said semiconductor chip; and
   internal circuit means into which said internal source voltage from said power switch circuit means is supplied,
   wherein said power switch circuit means further comprises an output transistor for, being supplied with said external source voltage, outputting said internal source voltage; start-up circuit means for controlling said output transistor so that the output current controlled to a predetermined value during the initial period following the turning "on" of an external power supply may flow in said output transistor; and control circuit means for controlling said start-up circuit means,
   wherein said control circuit means controls said start-up circuit means in response to the turning "on" of the external power supply so that said start-up circuit means may control said output transistor in such a way that said output current flowing in said output transistor during the initial period following the turning "on" of the external power supply may constitute effectively a constant increment as time passes,
   wherein said start-up circuit means comprises a bias element for biasing said output transistor so that said output current controlled to said predetermined value may flow in said output transistor during said initial period following the turning "on" of said external power supply,
   wherein said start-up circuit means comprises a first switch for relating the current value of said output transistor with the current value of said bias element during the initial period following the turning "on" of the external power supply and startup current generating circuit means for generating an output current constituting effectively a constant increment as the time passes during the initial period following the turning "on" of said external power supply,
   wherein said output current from said startup current generating circuit means constituting effectively said constant increment during said initial period following the turning "on" of said external power supply is supplied to said bias element, said control circuit means sets said first switch in the "on" state during the initial period following the turning "on" of said external power supply so that the current value of said output transistor may be related with the current value of said bias element, and said control circuit means sets said first switch in the "off" state during said initial period following the turning "on" of said external power supply so that the current value of said output transistor may be effectively rendered unrelated with the current value of said bias element;
   further comprising regulator means for generating an internal source voltage to be supplied to said internal circuit out of said external source voltage received,
   wherein said control circuit means controls said output transistor so that the fact that the difference between the value of said internal source voltage due to the charge of the load capacitance of said internal circuit with said output current of said output transistor during the initial period following the turning "on" of said external power supply and the value of said internal source voltage generated by said regulator means is within a predetermined limit may be detected, and as a result of the detection any increase in said output current flowing in said output transistor for the passage of time may be stopped;

further comprising a second switch connected between a voltage supply node to which any one voltage selected from said internal source voltage from said power switch circuit means and said internal source voltage from said regulator means is supplied and the output of said regulator means, wherein after said increase in said output current flowing in said output transistor for the passage of time has been stopped based on said result of detection, said control circuit means controls said second switch to be in the "on" state so that said internal source voltage generated by said regulator means may be supplied to said internal circuit means so that said internal source voltage generated by said regulator means may be supplied to said voltage supply node as said selected one voltage.

2. The semiconductor integrated circuit according to claim 1, wherein said regulator means comprises error amplifier means that compares a reference voltage from a reference voltage generating circuit means and the level of said internal source voltage to be outputted to said voltage supply node to control said level of said internal source voltage, and wherein said error amplifier means detects that the difference between the value of said internal source voltage due to the charge of the load capacitance of said internal circuit means by said output current of said output transistor controlled by said start-up circuit means during the initial period following the turning "on" of said external power supply and the value of said internal source voltage generated by said regulator means is within the predetermined limit.

3. The semiconductor integrated circuit according to claim 2, further comprising:

level shift circuit means for generating level shift output signals whose level have shifted to the ground potential side from said internal source voltage outputted in said voltage supply node; and a third switch connected between said level shift circuit means and the negative feedback terminal of the error amplifier means of said regulator means, wherein during the initial period following the turning "on" of said external power supply, said control circuit means controls said third switch in either one of the "off" state and the "on" state, and impresses said level shift output signals generated by said level shift circuit means onto the negative feedback input terminal of said regulator means so that a higher voltage determined by the level shift voltage of said level shift circuit means than said reference voltage during said initial period following the turning "on" of said external power supply may be generated in said voltage supply node.

4. A semiconductor integrated circuit comprising:

power switch circuit means for starting the output of internal source voltage into an internal source voltage supply line disposed in an encircling manner from an external source voltage supplied from outside of a semiconductor chip, and an internal circuit means to which said internal source voltage from said power switch circuit means is supplied, wherein said power switch circuit means includes an output transistor for outputting said internal source voltage out of said external source voltage supplied, start-up circuit means for controlling said output transistor so that the output current may flow in said output transistor during the initial period following the turning "on" of an external power supply, and control circuit means for controlling said start-up circuit means; and regulator means for generating an internal source voltage to be supplied to said internal circuit means out of said external source voltage supplied, wherein the fact that the difference between the value of said internal source voltage due to the charge of the load capacitance of said internal circuit means by said output current of said output transistor controlled by said start-up circuit means during the initial period following the turning "on" of said external power supply and the value of said internal source voltage generated by said regulator means is within the predetermined limit is detected, wherein the semiconductor integrated circuit further comprises a switch connected between a voltage supply node and the output of said regulator means, wherein said voltage supply node is supplied said internal source voltage from one of said power switch circuit means and said regulator means, and wherein based on a result of the detection, said control circuit means controls said switch to be in the "on" state so that said internal source voltage generated by said regulator means may be supplied to said internal circuit means so that said internal source voltage generated by said regulator means may be supplied to said voltage supply node as said selected one voltage.

5. The semiconductor integrated circuit according to claim 4, wherein said regulator means comprises error amplifier means that compares a reference voltage from a reference voltage generating circuit means and the level of said internal source voltage to be outputted to said voltage supply node to control said level of said internal source voltage, and wherein said error amplifier means detects that the difference between the value of said internal source voltage due to the charge of the load capacitance of said internal circuit means by said output current of said output transistor controlled by said start-up circuit means during the initial period following the turning "on" of said external power supply and the value of said internal source voltage generated by said regulator means is within the predetermined limit.

* * * * *